United States Patent
Yang et al.

(10) Patent No.: US 10,181,510 B2
(45) Date of Patent: Jan. 15, 2019

(54) SEMICONDUCTOR DEVICE AND METHOD FOR FABRICATING THE SAME

(71) Applicant: SAMSUNG ELECTRONICS CO., LTD., Suwon-si, Gyeonggi-Do (KR)

(72) Inventors: Jung Gil Yang, Hwaseong-si (KR); Seung Min Song, Hwaseong-si (KR); Sung Min Kim, Incheon (KR); Woo Seok Park, Ansan-si (KR); Geum Jong Bae, Suwon-si (KR); Dong Il Bae, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 9 days.

(21) Appl. No.: 15/726,535

(22) Filed: Oct. 6, 2017

(65) Prior Publication Data
US 2018/0261668 A1  Sep. 13, 2018

(30) Foreign Application Priority Data

Mar. 10, 2017  (KR) ......................... 10-2017-0030355

(51) Int. Cl.
| | |
|---|---|
| H01L 29/76 | (2006.01) |
| H01L 29/06 | (2006.01) |
| H01L 29/49 | (2006.01) |
| H01L 29/66 | (2006.01) |
| H01L 29/786 | (2006.01) |

(52) U.S. Cl.
CPC ........ *H01L 29/0673* (2013.01); *H01L 29/495* (2013.01); *H01L 29/4966* (2013.01); *H01L 29/6653* (2013.01); *H01L 29/6656* (2013.01); *H01L 29/66545* (2013.01); *H01L 29/66742* (2013.01); *H01L 29/78645* (2013.01)

(58) Field of Classification Search
CPC .............. H01L 29/0673; H01L 29/495; H01L 29/4966; H01L 29/6653; H01L 29/66545; H01L 29/66553; H01L 29/6656; H01L 29/66742; H01L 29/66795; H01L 29/78645
USPC ........................................................ 257/288
See application file for complete search history.

(56) References Cited

U.S. PATENT DOCUMENTS

| | | |
|---|---|---|
| 7,648,883 B2 | 1/2010 | Park |
| 8,778,768 B1 | 7/2014 | Chang et al. |
| 8,994,081 B2 | 3/2015 | Leobandung |

(Continued)

*Primary Examiner* — Brook Kebede
(74) *Attorney, Agent, or Firm* — F. Chau & Associates, LLC

(57) ABSTRACT

A method of manufacturing a semiconductor device is provided. A stacked structure including one or more sacrificial layers and one or more semiconductor layers are stacked on a substrate is formed. A dummy gate structure including a dummy gate and a dummy spacer on the stacked structure is formed. The stacked structure is etched using the dummy gate structure to form a first recess. The one or more sacrificial layers are etched. The dummy spacer is removed. A spacer film is formed on the dummy gate, the one or more semiconductor layer and the one or more sacrificial layers. The semiconductor layer and spacer film are etched to form a second recess using the dummy gate and spacer film. An external spacer formed on the dummy gate and an internal spacer formed on the one or more sacrificial layers are formed. A source/drain region is formed in the second recess.

19 Claims, 25 Drawing Sheets

(56) References Cited

U.S. PATENT DOCUMENTS

| | | |
|---|---|---|
| 9,431,512 B2 | 8/2016 | Koh et al. |
| 9,773,886 B1 * | 9/2017 | Palle ................. H01L 29/66553 |
| 9,799,748 B1 * | 10/2017 | Xie .................. H01L 29/66553 |
| 2014/0001441 A1 | 1/2014 | Kim et al. |
| 2014/0225169 A1 | 8/2014 | Suk et al. |
| 2016/0027870 A1 | 1/2016 | Cheng et al. |
| 2016/0111513 A1 | 4/2016 | Liu et al. |
| 2016/0190246 A1 | 6/2016 | Frank et al. |
| 2016/0190339 A1 | 6/2016 | Xie et al. |
| 2016/0204277 A1 | 7/2016 | Yang et al. |
| 2017/0069481 A1 * | 3/2017 | Doris ................. H01L 21/0228 |

* cited by examiner

SEMICONDUCTOR DEVICE AND METHOD FOR FABRICATING THE SAME

CROSS REFERENCE TO RELATED APPLICATION

This application claims priority under 35 USC § 119 to Korean Patent Application No. 10-2017-0030355, filed on Mar. 10, 2017, in the Korean Intellectual Property Office, the disclosure of which is incorporated herein in its entirety.

TECHNICAL FIELD

Exemplary embodiments of the present inventive concept relate to a semiconductor device and a method for fabricating the same.

DISCUSSION OF RELATED ART

As one of the endeavors for increasing the density of the semiconductor device, a multi-gate transistor with a silicon body having a fin or nanowire shape may be formed on a substrate, and a gate may be formed on the surface of the silicon body.

The multi-gate transistor may utilize three-dimensional channels. The multi-gate transistor may have an increased current control capability. The multi-gate transistor may suppress a short channel effect (SCE) by controlling the dimension of the three-dimensional channel.

SUMMARY

According to an exemplary embodiment of the present inventive concept, a method for manufacturing a semiconductor device includes forming a stacked structure including one or more sacrificial layers and one or more semiconductor layers. Each sacrificial layer of the one or more sacrificial layers and each semiconductor layer of the one or more semiconductor layers are alternately stacked on a substrate. The method further include forming a dummy gate structure including a dummy gate and a dummy spacer on the stacked structure, and etching the stacked structure using the dummy gate structure as a first mask to form a first recess and exposing the one or more sacrificial layers. The method still further includes etching a part of the one or more sacrificial layers expose by the first recess, removing the dummy spacer, and forming a spacer film on the dummy gate, the one or more semiconductor layers and the one or more sacrificial layers. The method further includes etching a part of a semiconductor layer of the one or more semiconductor layers and a part of the spacer film to form a second recess using the dummy gate and the spacer film formed on a side wall of the dummy gate as a second mask. The method still further includes forming an external spacer on the side wall of the dummy gate and an internal spacer on a side wall of the one or more sacrificial layers. The method further includes forming a source/drain region in the second recess.

According to an exemplary embodiment of the present inventive concept, a method for manufacturing a semiconductor device includes providing a substrate including a first and second regions. The method further includes forming a first stacked structure including a first sacrificial layer and a first semiconductor layer alternately stacked on the first region, and a second stacked structure including a second sacrificial layer and a second semiconductor layer alternately stacked on the second region. The method still further includes forming a first dummy gate on the first stacked structure, and forming a second dummy gate on the second stacked structure. The method still includes forming a second protective layer on the second stacked structure and the second dummy gate of the second region, and forming a first dummy spacer film on the upper surface of the first stacked structure and the first dummy gate. The method further includes etching the first dummy spacer film to form a first dummy spacer on a side wall of the first dummy gate, etching the first stacked structure using the first dummy gate and the first dummy spacer as a first mask to form a first recess, and etching a part of the first sacrificial layer exposed by the first recess. The method still further includes removing the first dummy spacer. The method further includes forming a first spacer film on the first dummy gate, the first semiconductor layer and the first sacrificial layer. The method still further includes etching a part of the first semiconductor layer and a part of the first spacer film to form a second recess, using the first dummy gate and the first spacer film formed on the side wall of the first dummy gate as a second mask, thereby forming a first external spacer formed on the side wall of the first dummy gate and a first internal spacer formed on a side wall of the first sacrificial layer. The method further includes forming a first source/drain region in the second recess, removing the second protective layer, and forming a first protective layer on the first source/drain region, the first dummy gate and the first external spacer of the first region.

According to an exemplary embodiment of the present inventive concept, a semiconductor device includes a first internal spacer including a plurality of first gate electrodes spaced apart from each other on a substrate, a first nanowire formed on the first internal spacer, and a second internal spacer including a plurality of second gate electrodes spaced apart from each other on the first nanowire. The semiconductor device further includes a second nanowire formed on the second internal spacer, a plurality of third gate electrodes formed on the second nanowires, and a source/drain region extending between the plurality of second gate electrodes in a direction perpendicular to a surface of the substrate. The plurality of first gate electrodes, the plurality of second gate electrodes, and the plurality of third gate electrodes are aligned with one another when viewed from a direction perpendicular to the surface of the substrate. A gate insulating film is formed on an outer surface of the each of the pluralities of first, second, and third gate electrodes.

According to an exemplary embodiment of the present inventive concept, a method for fabricating a semiconductor device includes forming a stacked structure including one or more sacrificial layers and one or more semiconductor layers alternately stacked on a substrate, forming a dummy gate structure including a dummy gate and a dummy spacer on the stacked structure. The method further includes etching the stacked structure in a downward direction using the dummy gate structure as a first mask to form a first recess, etching a portion of the one or more sacrificial layers in a horizontal direction to form a second recess, and etching the dummy spacer. The method further includes forming a spacer film on the dummy gate and the one or more semiconductor layer, and in the first and second recesses. The method further includes etching a portion of the one or more semiconductor layers and a portion of the spacer film in the downward direction to form a third recess, using the dummy gate and the spacer film formed on the dummy gate as a second mask, to form an internal spacer formed on the side wall of the sacrificial layer. The method still further includes forming a source/drain region in the third recess, forming a plurality of gate electrodes in the internal spacer, and manufacturing the integrated circuit having the plurality of gate electrodes.

BRIEF DESCRIPTION OF DRAWINGS

The above and other features of the present inventive concept will become more apparent by describing in detail exemplary embodiments thereof, with reference to the accompanying drawings, which.

DETAILED DESCRIPTION OF THE EMBODIMENTS

Exemplary embodiments of the present inventive concept will be described more fully hereafter with reference to the accompanying drawing. The present inventive concept may, however, be embodied in many different forms and should not be construed as limited to the embodiments set forth herein.

It will be understood that when an element such as a layer, film, region, or substrate is referred to as being "on" another element, it can be directly on the other element or intervening elements may also be present. It will be also understood that when an element such as a layer, film, region, or substrate is referred to as being "under" another element, it can be directly under the other element or intervening elements may also be present.

Hereinafter, a semiconductor device according to an exemplary embodiment of the present inventive concept will be described with reference to FIG. 1 to FIG. 4.

Figure 1:
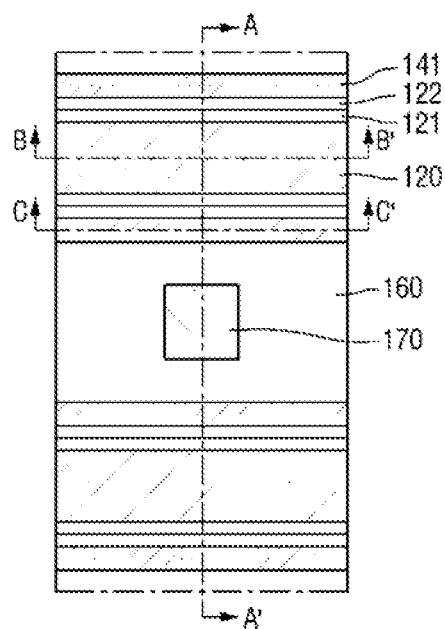
FIG. 1 is a plan view illustrating a semiconductor device according to an exemplary embodiment of the present inventive concept.
Figure 1:
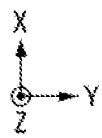
Figure 2:
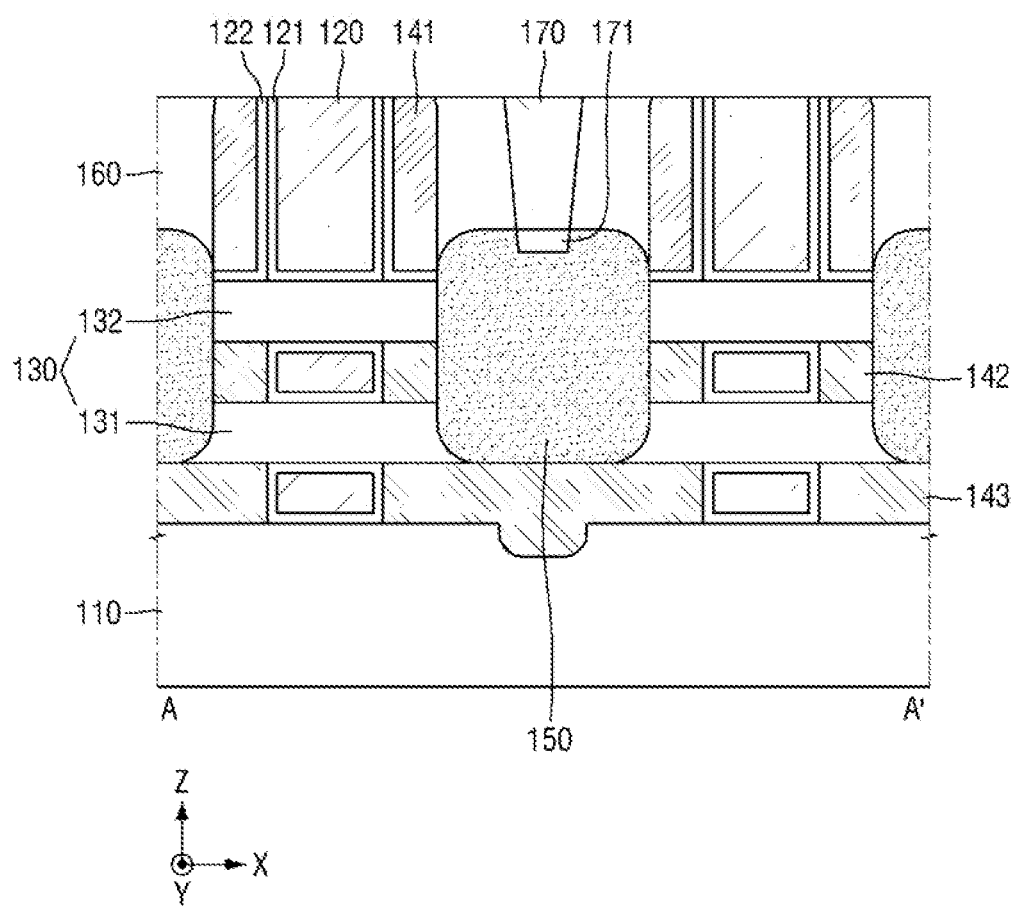
FIG. 2 is a cross-sectional view taken along line A-A' of FIG. 1.
Figure 3:
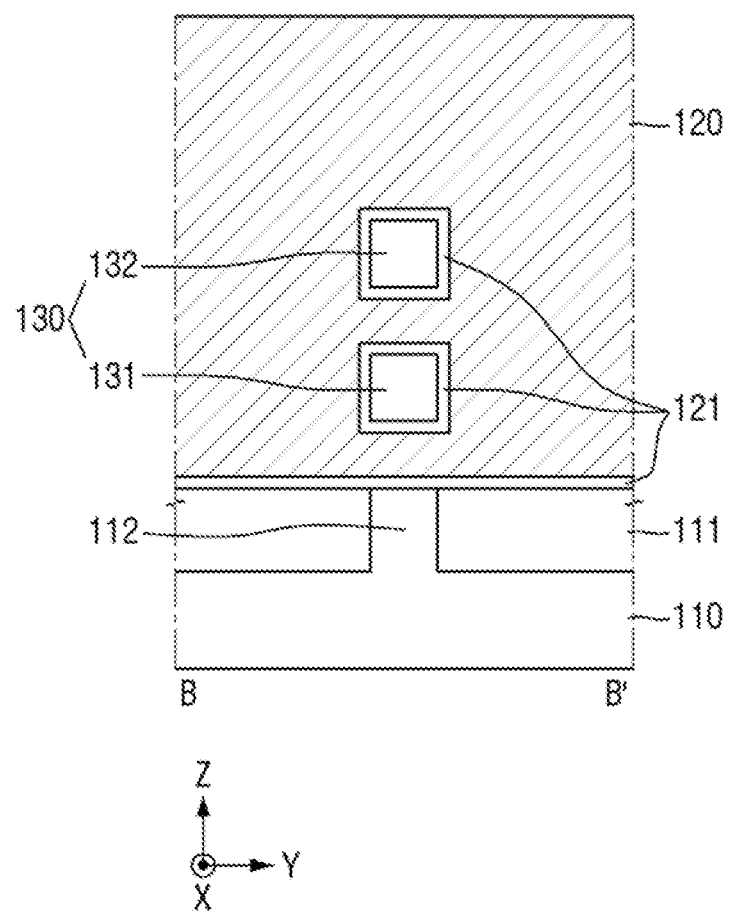
FIG. 3 is a cross-sectional view taken along line B-B' of FIG. 1.
Figure 4:
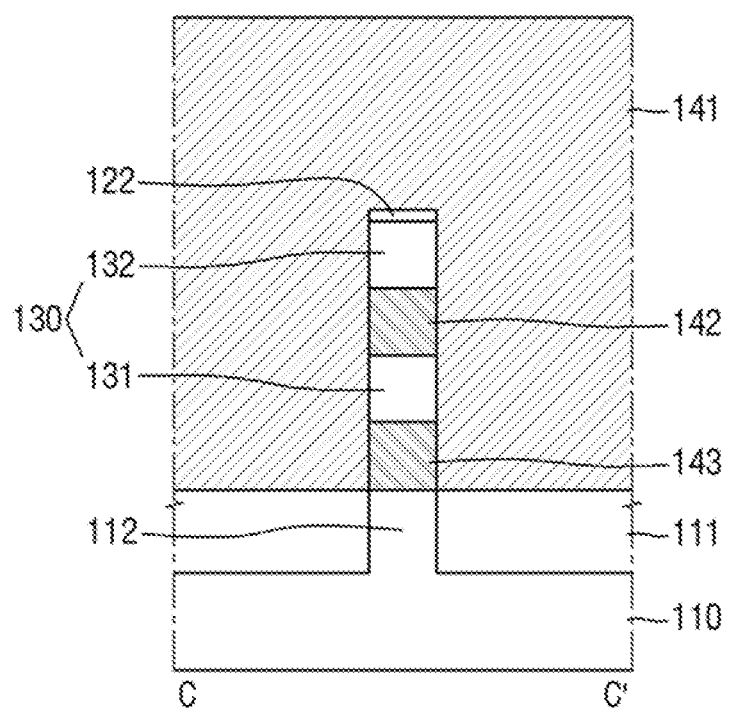
FIG. 4 is a cross-sectional view taken along line C-C' of FIG. 1.

FIG. 1 is a plan view illustrating a semiconductor device according to an exemplary embodiment of the present inventive concept. In an embodiment, the semiconductor device may include an integrated circuit. FIG. 2 is a cross-sectional view taken along the line A-A' of FIG. 1. FIG. 3 is a cross-sectional view taken along the line B-B' of FIG. 1. FIG. 4 is a cross-sectional view taken along the line C-C' of FIG. 1.

Referring to FIG. 1 to FIG. 4, a semiconductor device according to an exemplary embodiment of the present inventive concept includes a substrate 110, a field insulating film 111, a gate electrode 120, a gate insulating film 121, an insulating film 122, a plurality of nanowires 130, an external spacer 141, a first internal spacer 142, a second internal spacer 143, a source/drain region 150, an interlayer insulating film 160, a contact 170, and a silicide 171.

The substrate 110 may be, for example, bulk silicon or silicon-on-insulator (SOI). In another example, the substrate 110 may be a silicon substrate or may contain other materials, for example, silicon germanium (SiGe), indium antimonide (InSb), lead tellurium compounds, indium arsenide (InAs), indium phosphide (InP), gallium arsenide (GaAs) or gallium antimonide (GaSb). Or, the substrate 110 may be provided by an epitaxial layer formed on the substrate 110.

Further, the substrate 110 may include a pin-like pattern 112. The pin-like pattern 112 may protrude from the substrate 110. The field insulating film 111 may surround at least a part of the side wall of the pin-like pattern 112 as shown in FIG. 3. The pin-like pattern 112 may be defined by the field insulating film 111. The field insulating film 111 may include, for example, an oxide film, a nitride film, an oxynitride film, or a combination thereof.

In FIG. 3, although the side wall of the pin-like pattern 112 is illustrated as being entirely surrounded by the field insulating film 111, but the present inventive concept is not limited thereto.

In one embodiment, the pin-like pattern 112 may extend long in a first direction X. For example, the pin-like pattern 112 may include a first side extending in the first direction X, and a second side extending in a second direction Y, where the first side is longer than the second side.

The pin-like pattern 112 may be formed by etching a part of the substrate 110, and may include an epitaxial layer grown from the substrate 110. In one embodiment, the pin-like pattern 112 may include, for example, silicon or germanium which is an elemental semiconductor material. In another embodiment, the pin-like pattern 112 may include a compound semiconductor, and may include, for example, a group IV-IV compound semiconductor or a group III-V compound semiconductor.

For example, in the case of group IV-IV compound semiconductor, the pin-like pattern 112 may be a binary compound or a ternary compound including at least two or more of carbon (C), silicon (Si), germanium (Ge), tin (Sn), or a compound in which the elements are doped with group IV element.

In the case of group III-V compound semiconductor, the pin-like pattern 112 may be a binary compound, a ternary compound, or a quaternary compound formed by combination of at least one of aluminum (Al), gallium (Ga), or indium (In) as the group III element with one of phosphorus (P), arsenic (As) or antimony (Sb) as the group V element.

In the semiconductor device according to exemplary embodiments of the present inventive concept, the pin-like pattern 112 may include silicon.

The plurality of nanowires 130 may include a first nanowire 131 and a second nanowire 132 extending, for example, in the first direction X as shown in FIG. 2. The semiconductor devices exemplarily described herein may be illustrated as including two nanowires 130. but the present inventive concept is not limited thereto. For example, in other exemplary embodiments, the semiconductor device may include one nanowire, or more than two nanowires 130.

The first nanowire 131 may be formed on the substrate 110 so as to be spaced apart from the substrate 110. The first nanowire 131 may be formed to extend in the first direction X.

In one embodiment, the first nanowire 131 may be formed on the pin-like pattern 112 so as to be spaced apart from the pin-like pattern 112. The first nanowire 131 may overlap the pin-like pattern 112 when viewed in the third direction Z. The first nanowire 131 may not be formed on the field insulating film 111. For example, the first nanowire 131 may be formed on the pin-like pattern 112.

In one embodiment, the first nanowire 131 may have an inclination profile in which the width in the first direction X may increase as the first nanowire 131 is closer to the pin-like pattern. But, the present inventive concept is not limited thereto.

For example, in FIG. 3, the width of the first nanowire 131 in the second direction Y may be the same as the width of the pin-like pattern 112 in the second direction Y. But, the present inventive concept is not limited thereto. In one embodiment, the cross-section of the first nanowire 131 may be rectangular as shown in FIG. 3. But, the present inventive concept is not limited thereto. For example, the corners of the first nanowire 131 may be rounded by, for example, trimming process.

The first nanowire 131 may be used as a channel region of the transistor. The first nanowire 131 may differ depending on whether the semiconductor device is a PMOS (p-channel MOSFET) or an NMOS (n-channel MOSFET). But, the present inventive concept is not limited thereto.

Further, the first nanowire 131 may include the same material as the pin-like pattern 112, or may include materials different from the pin-like pattern 112. However, in the semiconductor device according to exemplary embodiments of the present inventive concept, the first nanowire 131 will be described as containing silicon.

The second nanowire 132 may be formed on the substrate 110 so as to be spaced apart from the substrate 110. The second nanowire 132 may be formed to extend, for example, in the first direction X.

The second nanowire 132 may be formed farther away from the substrate 110 than the first nanowire 131. For example, the distance from the upper surface of the pin-like pattern 112 to the second nanowire 132 may be greater than the distance from the upper surface of the pin-like pattern 112 to the first nanowire 131.

The second nanowire 132 may overlap the pin-like pattern 112 when viewed in the third direction Z. In another embodiment, the second nanowire 132 may not be formed on the field insulating film 111 but may be formed on the pin-like pattern 112 when viewed in the third direction Z.

The second nanowire 132 may be used as the channel region of the transistor. Therefore, in one embodiment, the second nanowire 132 may include the same material as the first nanowire 131.

The gate electrode 120 may be formed on the field insulating film 11 and the pin-like pattern 112. In one embodiment, the gate electrode 120 may extend in the second direction Y.

The gate electrode 120 may be formed to surround the first nanowire 131 and the second nanowire 132 that are formed to be spaced apart from the upper surface of the pin-like pattern 112. The gate electrode 120 may also be formed in a space between the pin-like pattern 112 and the first nanowire 131. Further, the gate electrode 120 may also be formed in a space between the first nanowire 131 and the second nanowire 132.

In one embodiment, the gate electrode 120 may include a conductive material. Although the gate electrode 120 may be illustrated as a single layer, the present inventive concept is not limited thereto. For example, in another embodiment, the gate electrode 120 may include a work function conductive layer which may adjust the work function, and a filling conductive layer which may fill the space formed by the work function conductive layer.

In one embodiment, the gate electrode 120 may include at least one of TiN, WN, TaN, Ru, TiC, TaC, Ti, Ag, Al, TiAl, TiAlN, TiAlC, TaCN, TaSiN, Mn, Zr, W, or Al. Further, the gate electrode 120 may be made of Si, SiGe or the like rather than metal. The gate electrode 120 may be formed using, for example, a replacement process. But, the present inventive concept is not limited thereto.

The gate insulating film 121 may be formed between the first nanowire 131 and the gate electrode 120, and between the second nanowire 132 and the gate electrode 120. Further, the gate insulating film 121 may be formed between the field insulating film 111 and the gate electrode 120, between the pin-like pattern 112 and the gate electrode 120, between the insulating film 122 and the gate electrode 120, between the first internal spacer 142 and the gate electrode 120, or between the second internal spacer 143 and the gate electrode 120.

For example, the gate insulating film 121 may include an interfacial film and a high dielectric constant (k) insulating film. But, the present inventive concept is not limited thereto. For example, the gate insulating film 121 may not include the interfacial film, depending on, for example, the material composition of the first and second nanowires 131 and 132 and the like.

The gate insulating film 121 may be formed along the circumference of the first and second nanowires 131 and 132. The gate insulating film 121 may be formed along the upper surface of the field insulation film 111 and the upper surface of the pin-like pattern 112. In addition, the gate insulating film 121 may be formed along the side walls of the external spacer 141, the first internal spacer 142, and the second internal spacer 143.

For the first and second nanowires 131 and 132 including silicon, the interfacial film may include a silicon oxide film.

The high dielectric constant insulating film may include a dielectric material having a dielectric constant higher than the dielectric constant of silicon oxide film. For example, the dielectric material may contain one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. But, the present inventive concept is not limited thereto.

For the gate insulating film 121 which does not include the interfacial film, the high dielectric constant insulating film may include the silicon oxide film, a silicon oxynitride film, a silicon nitride film, or the like as well as the aforementioned dielectric materials.

The insulating film 122 may be formed between the gate insulating film 121 and the external spacer 141, and between the external spacer 141 and the second nanowire 132. The insulating film 122 may include, for example, silicon oxycarbonitride (SiOCN). But, the present inventive concept is not limited thereto.

The external spacer 141 may be formed on the insulating film 122 formed on both side walls of the gate electrode 120 extending, for example, in the second direction Y.

The external spacer 141 may include at least one of silicon nitride (SiN), silicon oxynitride (SiON), silicon oxide (SiO$_2$), silicon oxycarbonitride (SiOCN), or a combination thereof.

In one embodiment, the external spacer 141 may include the same material as the insulating layer 122. For example, the insulating film 122 may include silicon oxycarbonitride (SiOCN), and the external spacer 141 may include silicon oxycarbonitride (SiOCN). However, the present inventive concept is not limited thereto. For example, in another embodiment, the insulating film 122 and the external spacer 141 may include different materials from each other The first internal spacer 142 may be formed on both sides of the gate electrode 120 between the first nanowire 131 and the second nanowire 132. In one embodiment, the first internal spacer 142 may come into contact with a portion of the side surfaces of the first and second nanowires 131 and 132.

The first internal spacer 142 may be made of, for example, at least one of a low dielectric constant dielectric material, which may include silicon nitride (SiN), silicon oxynitride (SiON), silicon oxide (SiO$_2$), silicon oxycarbonitride (SiOCN), or a combination thereof. The low dielectric constant dielectric material may be a material having the dielectric constant lower than or equal to the silicon oxide.

In one embodiment, the first internal spacer 142 and the external spacer 141 may include the same material. For example, the external spacer 141 may include silicon oxycarbonitride (SiOCN), and the first internal spacer 142 may also include the silicon oxycarbonitride (SiOCN). In this case, the first internal spacer 142 may have the dielectric constant less than 5.

Thus, in the semiconductor device according to an exemplary embodiment of the present inventive concept, the dielectric constant of the first internal spacer 142 may be reduced to reduce a fringing capacitance between the gate electrode 120 and the source/drain region 150.

But, the present inventive concept is not limited thereto. For example, in another embodiment, the first internal spacer 142 and the external spacer 141 may include different materials from each other.

The side wall of the first internal spacer 142 and the side wall of the second nanowire 132 may be aligned to each other. In one embodiment, the side wall of the first internal spacer 142 adjacent to the source/drain region 150 may be aligned with the side wall of the second nanowire 132 adjacent to the source/drain region 150 as shown in FIG. 2. For example, the first internal spacer 142 may not be formed in a concave shape relative to the gate electrode 120.

As a result, according to an exemplary embodiment of the present inventive concept, the side wall of the first internal spacer 142 and the side wall of the second nanowire 132 may be aligned to each other, and the first internal spacer 142 may be formed to be relatively thick compared to, for example, the first internal spacer 142 with the concave shape.

The second internal spacer 143 may be formed on both sides of the gate electrode 120 between the first nanowire 131 and the substrate 110. In one embodiment, the second internal spacer 143 may come into contact with a portion of the side surface of the first nanowire 131.

Further, the second internal spacer 143 may be formed between the substrate 110 and the source/drain region 150, and a part of the second internal spacer 143 may be formed in a recess formed on the substrate 110. However, the second internal spacer 143 may not be formed between the substrate 110 and the gate electrode 120.

Accordingly, in the semiconductor device according to an exemplary embodiment of the present inventive concept, the second internal spacer 143 which is an insulating layer between the substrate 110 and the source/drain region 150, provides the semiconductor device with added insulation and increased reliability.

The second internal spacer 143 may include, for example, at least one of a low dielectric constant dielectric material, silicon nitride (SiN), silicon oxynitride (SiON), silicon oxide (SiO$_2$), silicon oxycarbonitride (SiOCN), and a combination thereof. The low dielectric constant dielectric material may be a material having the dielectric constant lower than or equal to the silicon oxide.

In one embodiment, the second internal spacer 143 may include the same material as the external spacer 141 and the first internal spacer 142. For example, the external spacer 141 and the first internal spacer 142 may include the silicon oxycarbonitride (SiOCN), and the third internal spacer may include the silicon oxycarbonitride (SiOCN). In this case, the second internal spacer 143 may have a dielectric constant (k) less than 5.

But, the present inventive concept is not limited thereto. For example, in another embodiment, the second internal spacer 143 and the external spacer 141 may include different materials from each other.

In one embodiment, the source/drain region 150 may be formed on at least one side of the gate electrode 120. The source/drain region 150 may be formed on the second internal spacer 143. The source/drain region 150 may include an epitaxial layer formed on the upper surface of the second internal spacer 143.

The outer peripheral surface of the source/drain region 150 may have various shapes. For example, the outer peripheral surface of the source/drain region 150 may be at least one of a diamond shape, a circular shape, a rectangular shape, or an octagonal shape.

The source/drain region 150 may be directly connected to the first and second nanowires 131 and 132 that may be used as the channel region.

On the other hand, the source/drain region 150 may not come into direct contact with the gate insulating film 121. A spacer may be located between the source/drain region 150 and the gate insulating film 121. In one embodiment, one side wall of the first internal spacer 142 may come into contact with the gate insulating film 121, and the other side wall of the first internal spacer 142 may come into contact with the source/drain region 150 as shown, for example in FIG. 2. Therefore, the source/drain region 150 and the gate insulating film 121 may not come into contact with each other when positioned between the first nanowire 131 and the second nanowire 132. Further, the external spacer 141 may be formed on an uppermost part of the second nanowire 132, and the source/drain region 150 and the gate insulating film 121 may not come into contact with each other on the second nanowire 132.

The interlayer insulating film 160 may be formed to cover a part of the external spacer 141 and the source/drain region 150, and the contact 170 may be connected to the source/drain region 150 through the interlayer insulating film 160. In this case, a silicide layer 171 may be formed between the contact 170 and the source/drain region 150.

Hereinafter, a method for fabricating a semiconductor device according to an exemplary embodiment of the present inventive concept will be described with reference to FIG. 5 to FIG. 15.

FIG. 5 to FIG. 15 are cross-sectional views for describing a method for fabricating a semiconductor device according to an exemplary embodiment of the present inventive concept.

Figure 5:
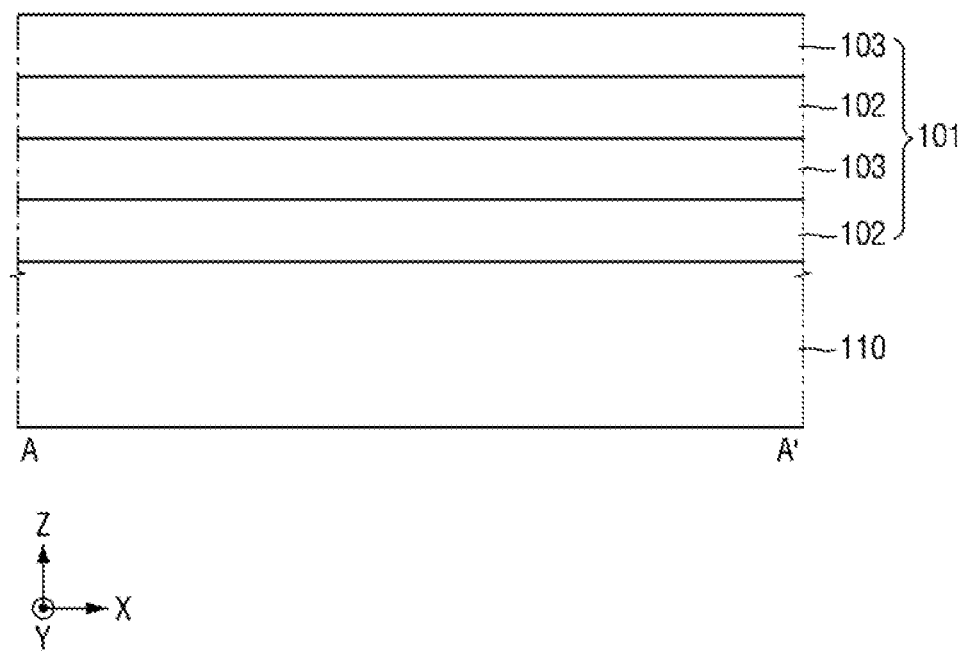
FIG. 5 to FIG. 15 are cross-sectional views describing a method for fabricating a semiconductor device according to one or more exemplary embodiments of the present inventive concept.

Referring to FIG. 5, a stacked structure 101 in which a sacrificial layer 102 and a semiconductor layer 103 are alternately stacked may be formed on the substrate 110.

Each sacrificial layer 102 in the stacked structure 101 may include the same material, and the sacrificial layer 102 and the semiconductor layer 103 may include different materials from each other. In the method for fabricating a semiconductor device according to an exemplary embodiment of the present inventive concept, each sacrificial layer 102 will be described as including the same material. Further, the semiconductor layer 103 may include a material having a selectivity in etch ratio to the sacrificial layer 102.

For example, the substrate 110 and the semiconductor layer 103 may include materials that may be used for the channel region of the transistor. For example, in the case of PMOS, the semiconductor layer 103 may include a material with increased hole mobility, and in the case of NMOS, the semiconductor layer 103 may include a material with increased electron mobility.

The sacrificial layer 102 may include a material having a lattice constant and a lattice structure similar to those of the semiconductor layer 103. For example, the sacrificial layer 102 may be a semiconductor material. In another example, the sacrificial layer 102 may be a crystallized metal material.

In the method for fabricating a semiconductor device according to an exemplary embodiment of the present inventive concept, it is described that the semiconductor layer 103 may include the silicon (Si), and the sacrificial layer 102 may include the silicon germanium (SiGe), respectively.

Although the two semiconductor layers 103 are illustrated in FIG. 5, the present inventive concept is not limited thereto. For example, the sacrificial layer 102 and the semiconductor layer 103 may alternately form a plurality of pairs, and the semiconductor layer 103 may be formed on the uppermost sacrificial layer 102.

Further, the sacrificial layer 102 may be illustrated as being located at the uppermost part of the stacked structure 101. But, the present inventive concept is not limited thereto. For example, the semiconductor layer 103 may be located at the uppermost part of the stacked structure 101 in another embodiment.

Figure 6:
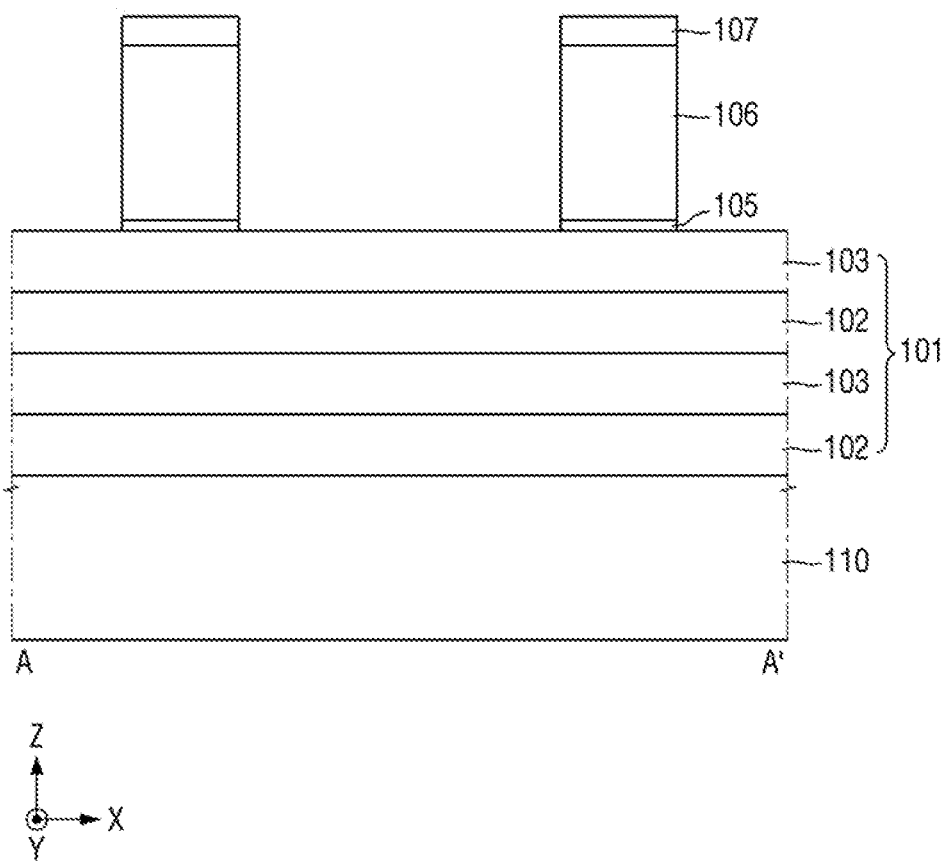

Referring to FIG. 6, a dummy gate 106 may be formed by performing an etching process using the mask pattern 107 as a mask. The dummy gate 106 may extend in the second direction Y, and may intersect with the stacked structure 101 formed on the substrate 110.

In this case, the dummy gate insulating film 105 may be formed between the stacked structure 101 and the dummy gate 106. The dummy gate insulating film 105 may include, for example, the silicon oxide film, and the dummy gate 106 may include, for example, polysilicon or amorphous silicon.

Figure 7:
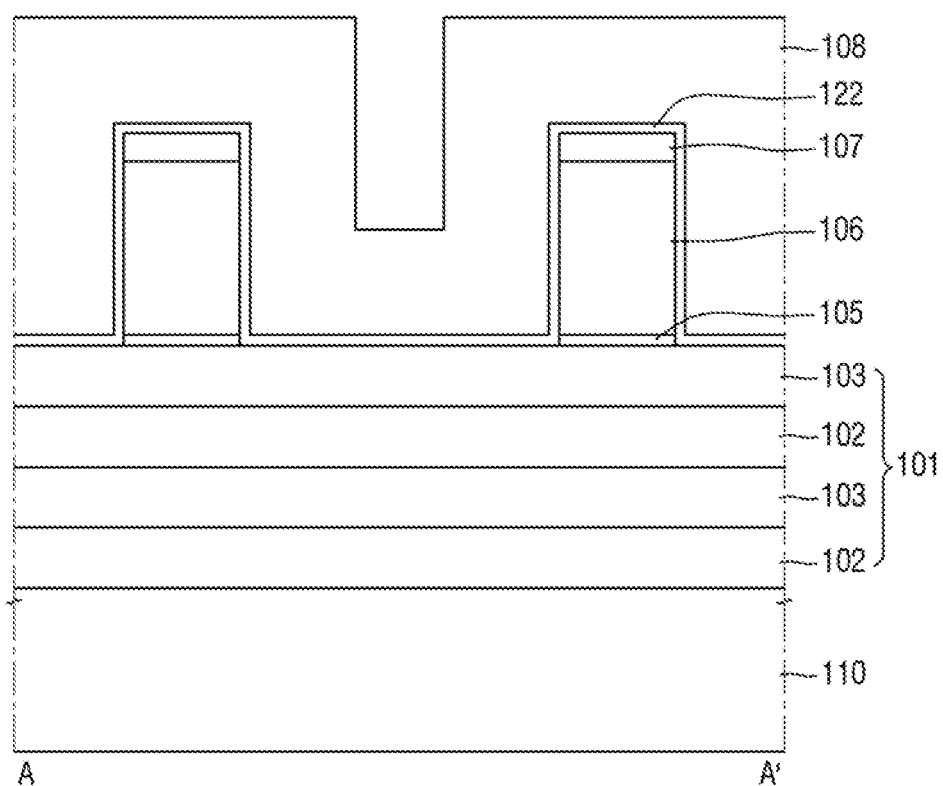

Referring to FIG. 7, the insulating film 122 may be conformally formed to cover the upper surface of the stacked structure 101, the side surfaces of the dummy gate insulating film 105, the side surfaces of the dummy gate 106, and the top and side surface of the mask pattern 107. The insulating film 122 may include, for example, the silicon oxycarbonitride (SiOCN). But, the present inventive concept is not limited thereto.

A dummy spacer film 108 may be conformally formed on the insulating film 122. The insulating film 122 may include, for example, the silicon oxide ($SiO_2$). But, the present inventive concept is not limited thereto.

In this case, the dummy spacer film 108 may be formed to be thicker than a spacer film (140 of FIG. 11) that may be formed in a later process step.

Figure 8:
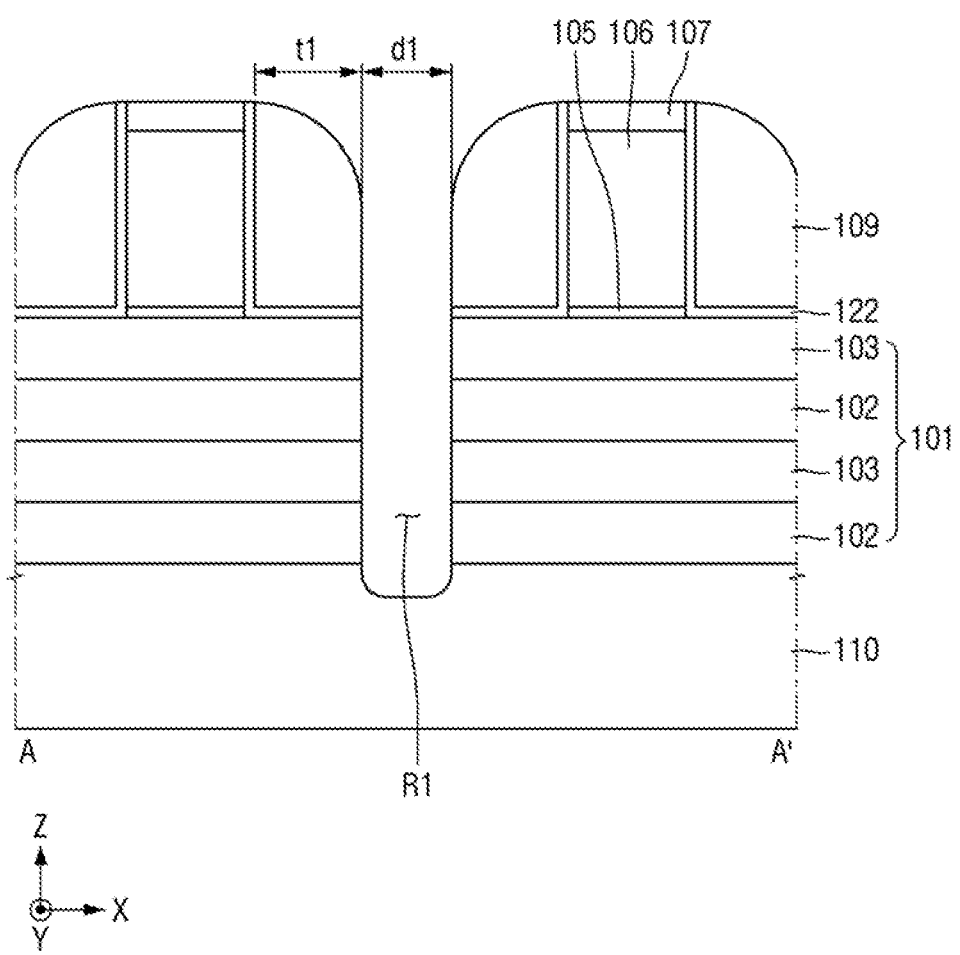

Referring to FIG. 8, the dummy spacer film 108 may be etched back to expose the upper surface of the stacked structure 101 and the mask pattern 107, thereby forming a dummy spacer 109 on both side walls of the dummy gate 106.

The stacked structure 101 and the substrate 110 may be partially etched, using the dummy gate structure including the dummy gate 106 and the dummy spacer 109 as the mask, thereby forming a first recess R1.

Figure 9:
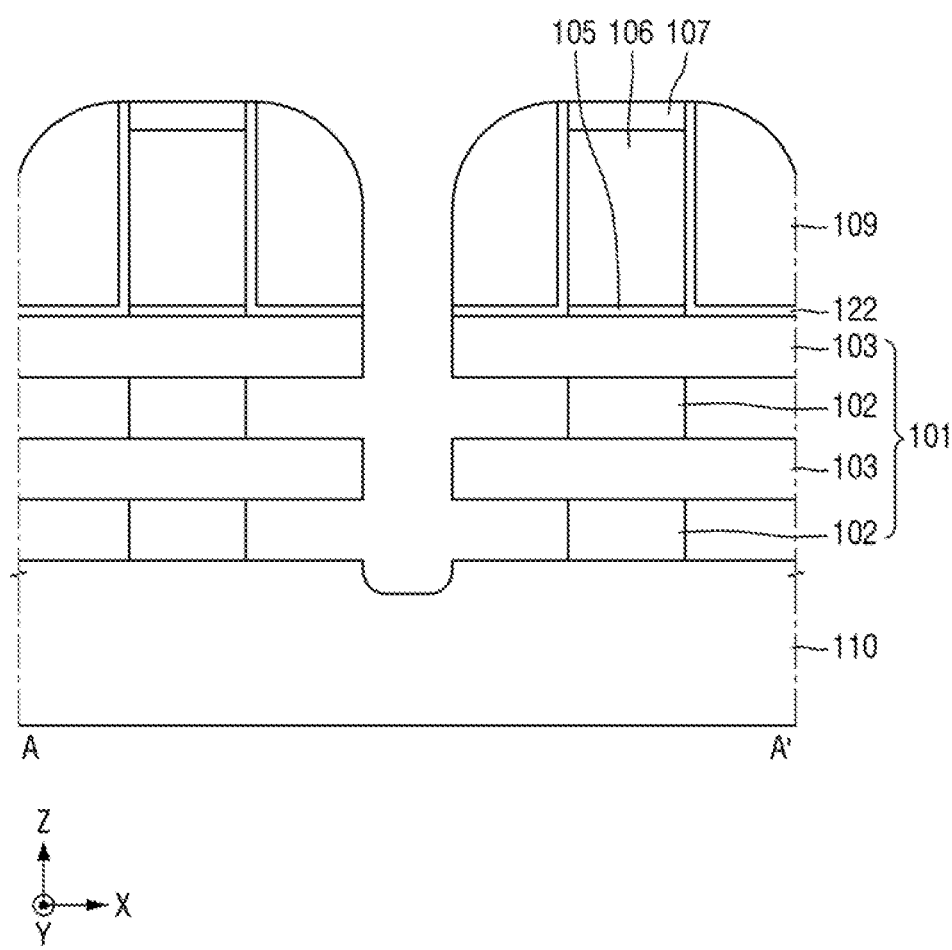

Referring to FIG. 9, the sacrificial layer 102 exposed by the first recess R1 may be partially etched. In one embodiment, the sacrificial layer 102 may be formed by the first recess R1, and the sacrificial layer 102 may be partially etched. For example, the sacrificial layer 102 may be etched in a first direction X from the cross-sections of the first and second nanowires 131 and 132 exposed by the first recessed portion R1.

Such a process may be performed, for example, using a selective etching process. In one embodiment, such a process may be performed through the etching process, using an etchant in which the etching rate of the sacrificial layer 102 may be greater than the etching rate for the first and second nanowires 131 and 132.

In one embodiment, FIG. 9 illustrates a configuration in which the side surfaces of the sacrificial layer 102 are etched into a planar shape. On the other hand, the side surfaces of the sacrificial layer 102 may have a concave shape in another embodiment.

Figure 10:
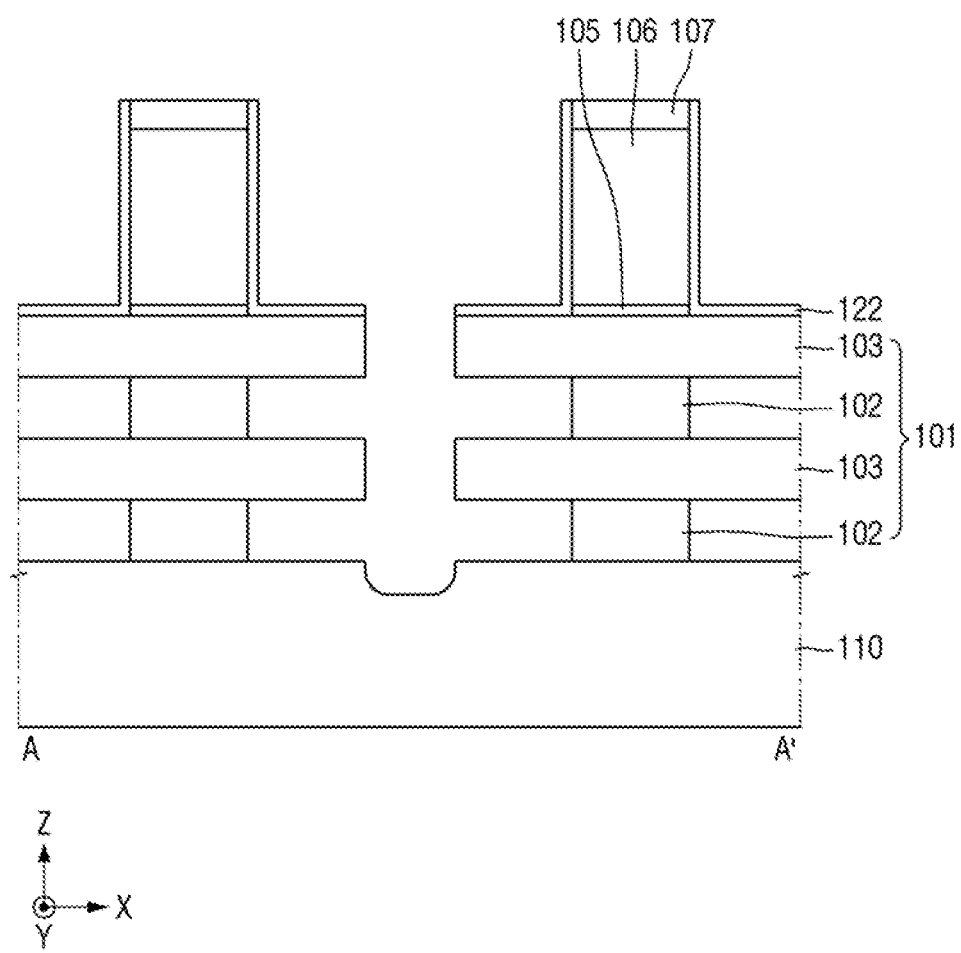
Figure 11:
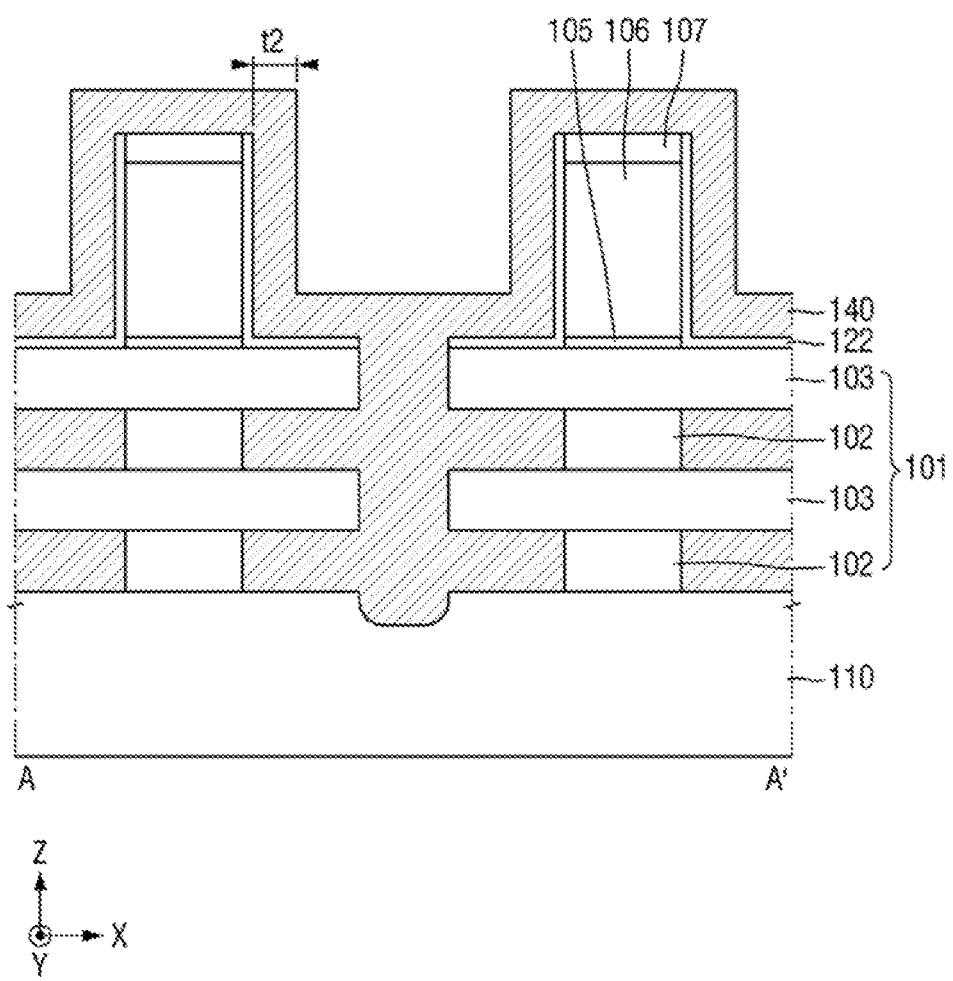

Next, referring to FIG. 10 and FIG. 11, after removing the dummy spacer 109, the spacer film 140 may be formed on the mask pattern 107, the insulating film 122, the sacrificial layer 102 exposed by the first recess R1, the semiconductor layer 103 exposed by the first recess R1, and the substrate 110 exposed by the first recess R1.

In this case, the thickness t2 of the spacer film 140 may be formed to be thinner than the thickness t1 of the dummy spacer 109 illustrated in FIG. 8. For example, the thickness t1 of the dummy spacer 109 illustrated in FIG. 8 may be formed to be greater than the thickness t2 of the external spacer 141 formed in the later processes steps.

The spacer film 140 may include a low dielectric constant dielectric material, e.g., the silicon oxycarbonitride (SiOCN).

Figure 12:
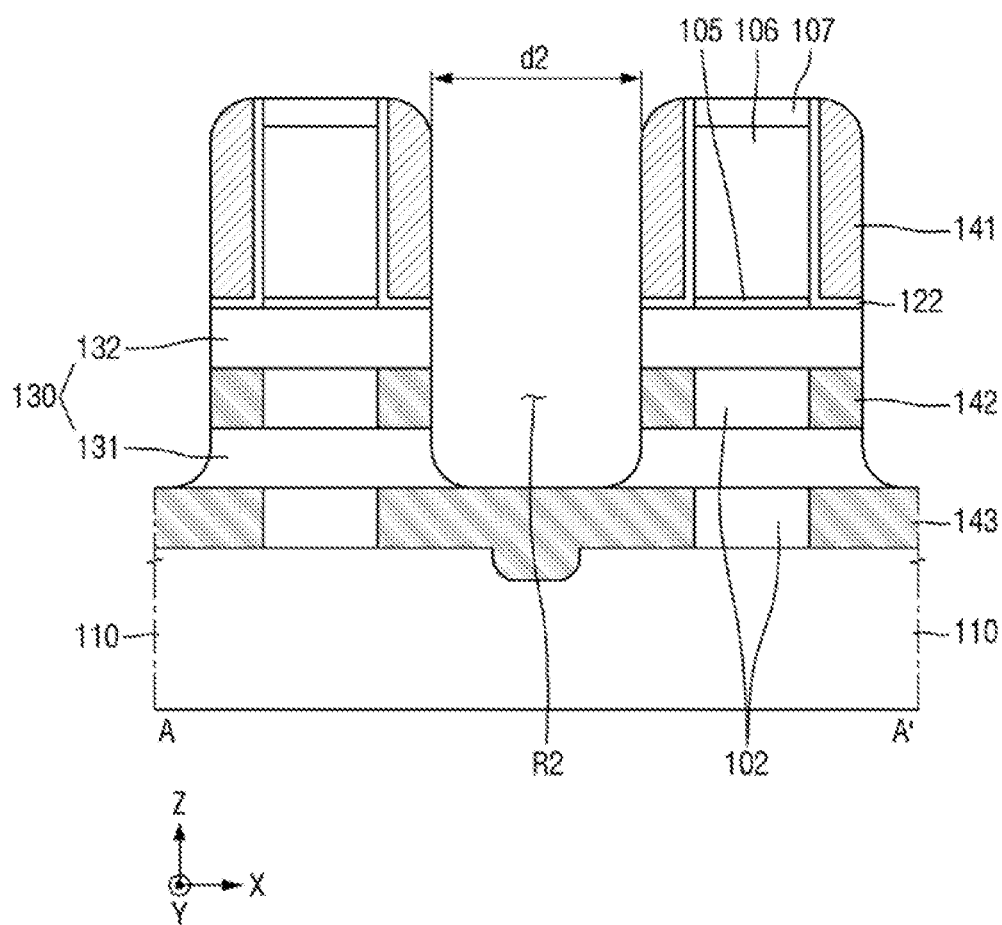

Referring to FIG. 12, a second recess R2 may be formed by etching a part of the semiconductor layer 103, a part of the insulating film 122 and a part of the spacer film 140, using the external spacer 141 formed on the side walls of the mask pattern 107 and the dummy gate 106 as a mask. In one embodiment, the second internal spacer 143 may not be etched, and the second recess R2 may be formed on the second internal spacer 143. For example, the second internal spacer 143 may not include the second recess R2.

In one embodiment, the width d2 of the second recess R2 may be formed to be greater than the width d1 of the first recess R1 illustrated in FIG. 8.

Accordingly, in a method for fabricating a semiconductor device according to an exemplary embodiment of the present inventive concept, the side wall of the external spacer 141 formed on the side wall of the dummy gate 106 may be aligned with the side wall of the second nanowire 132, and the side wall of the first internal spacer 142 formed on the side wall of the sacrificial layer 102 between the first nanowire 131 and the second nanowire 132.

In one embodiment, the side wall of the first internal spacer 142 may be aligned with the side wall of the second nanowire 132 exposed by the second recess R2.

In another embodiment, in the method for fabricating a semiconductor device according to an exemplary embodiment of the present inventive concept, the external spacer 141, the first internal spacer 142 and the second internal spacer 143 may include the same material (for example, the silicon oxycarbonitride (SiOCN)).

Figure 13:
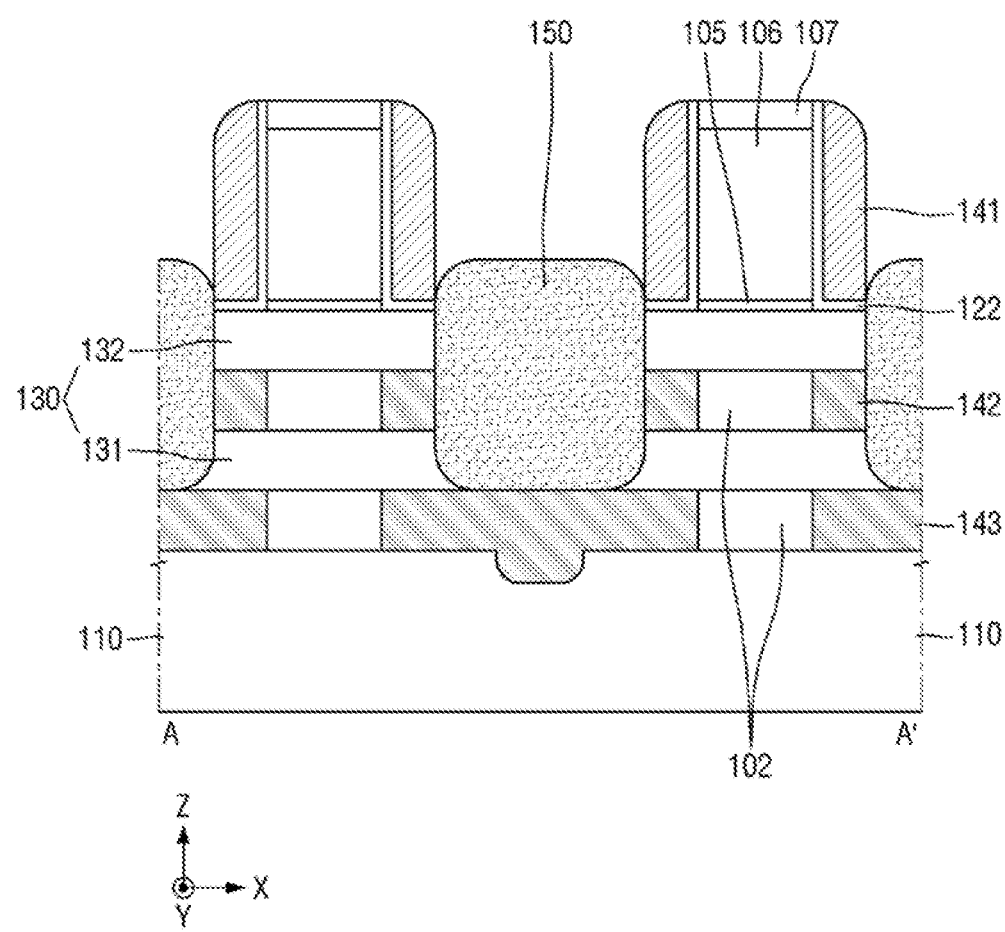

Referring to FIG. 13, the source/drain region 150 may be formed in the second recess R2 using, for example, an epitaxial process.

Figure 14:
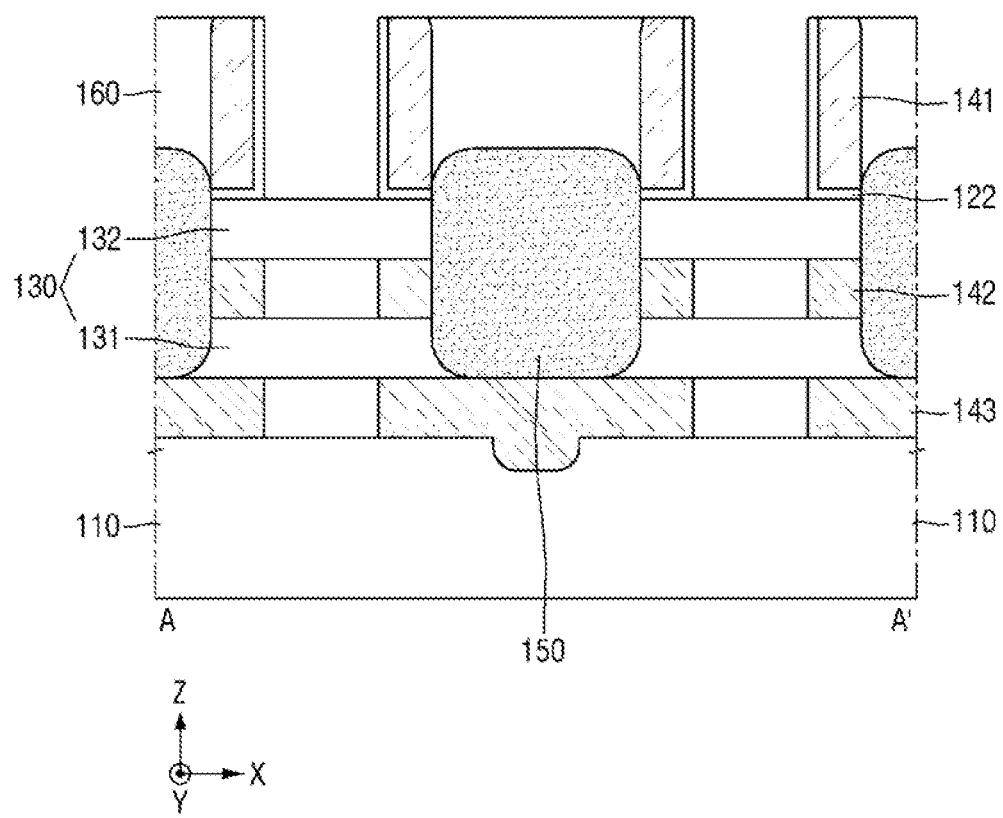

Referring to FIG. 14, an interlayer insulating film 160 may be formed on the field insulating film 111. In one embodiment, the interlayer insulating film 160 may cover the source/drain region 150, the external spacer 141, the insulating film 122 and the mask pattern 107.

The interlayer insulating film 160 may be planarized to remove the mask pattern 107 until the upper surface of the dummy gate 106 is exposed.

The dummy gate insulating film 105 and the dummy gate 106 may be removed. As a result, the first and second nanowires 131, 132 that are overlapped with the dummy gate 106 in the third direction Z may be exposed.

Figure 15:
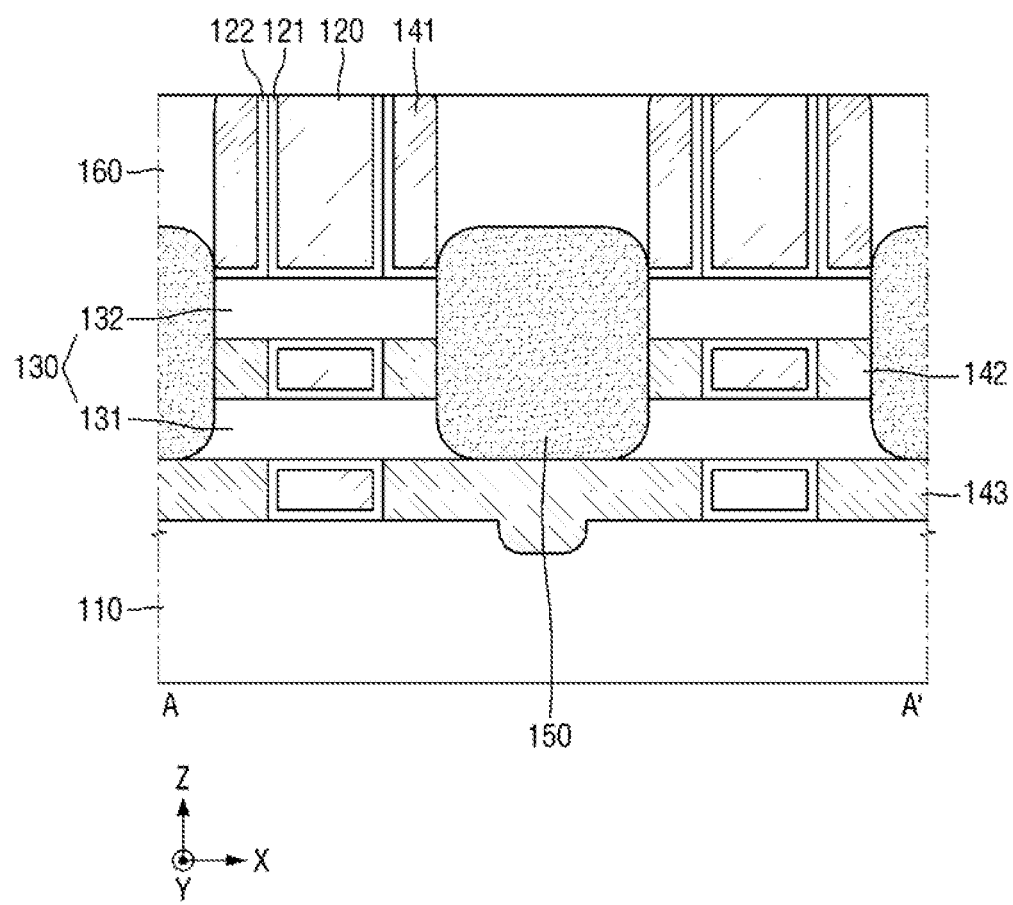
Figure 16:
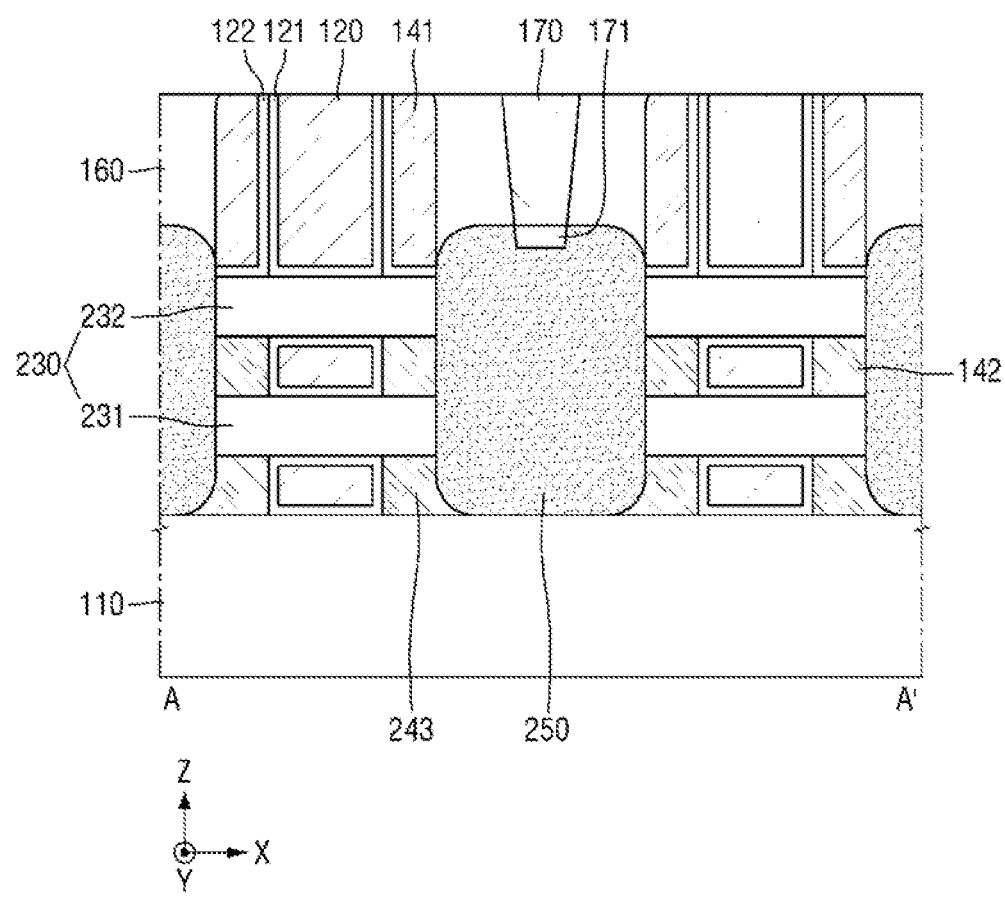
FIG. 16 is a cross-sectional view describing a method for fabricating a semiconductor device according to an exemplary embodiment of the present inventive concept.

Referring to FIG. 15, the gate insulating film 121 and the gate electrode 120 may be formed in a region where the dummy gate insulating film 105 and the dummy gate 106 are removed. A contact 170 and a silicide 171 may be formed in the interlayer insulating film 160. For example, the contact 170 and the silicide 171 may penetrate the interlayer insulating film 160 to contact the source/drain region 150 as shown in FIG. 16, and the semiconductor device illustrated in FIG. 2 may be manufactured.

In the method for fabricating a semiconductor device according to an exemplary embodiment of the present inventive concept, the external spacer 141, the first internal spacer 142, and the second internal spacer 143 may be formed using the same material (for example, the silicon oxycarbonitride (SiOCN)) to have the dielectric constant of the first and second internal spacers 142 and 143 to be low, and the fringing capacitance between the gate electrode 120 and the source/drain region 150 may be reduced.

Further, in the method for fabricating a semiconductor device according to an exemplary embodiment of the present inventive concept, the side wall of the first internal spacer 142 and the side wall of the second nanowire 132 may be aligned to each other by two recess forming processes, and the thickness of the first internal spacer 142 may be formed to be relatively thick compared to, for example, the first internal spacer 142 with, for example, the concave shape.

In the method for fabricating a semiconductor device according to an exemplary embodiment of the present inventive concept, a second internal spacer 143 may be formed as an insulating layer between the substrate 110 and the source/drain region 150 for increased reliability of the semiconductor device.

Hereinafter, a semiconductor device and a method for fabricating a semiconductor device according to another exemplary embodiment of the present inventive concept may be described with reference to FIG. 16 through FIG. 18.

FIG. 16 is a cross-sectional view describing a method for fabricating a semiconductor device according to an exemplary embodiment of the present inventive concept. FIG. 17 and FIG. 18 are intermediate step diagrams for describing a method for fabricating a semiconductor device according to another exemplary embodiment of the present inventive concept. Description of the semiconductor device and the method for fabricating the semiconductor device already illustrated in FIG. 1, FIG. 2, and FIG. 5 to FIG. 15 will not be described in detail herein except as necessary for a complete understanding of the present inventive concept.

Referring to FIG. 16, for example, a difference in the semiconductor device illustrated in FIG. 16 from the semiconductor device illustrated in FIG. 2 may be that the source/drain region 250 is formed adjacent to the substrate 110.

In one embodiment, the source/drain region 250 may be formed adjacent to the side wall of the second internal spacer 243, and the side wall of the second internal spacer 243 adjacent to the source/drain region 250 may have a inclination profile in which the width of the second internal spacer 243 may increase toward the substrate 110.

Further, the side wall of the first nanowire 231 adjacent to the source/drain region 250, the side wall of the first internal spacer 142 adjacent to the source/drain region 250, and the side wall of the second nanowire 232 adjacent to the source/drain region 250 may be aligned with one another.

Figure 17:
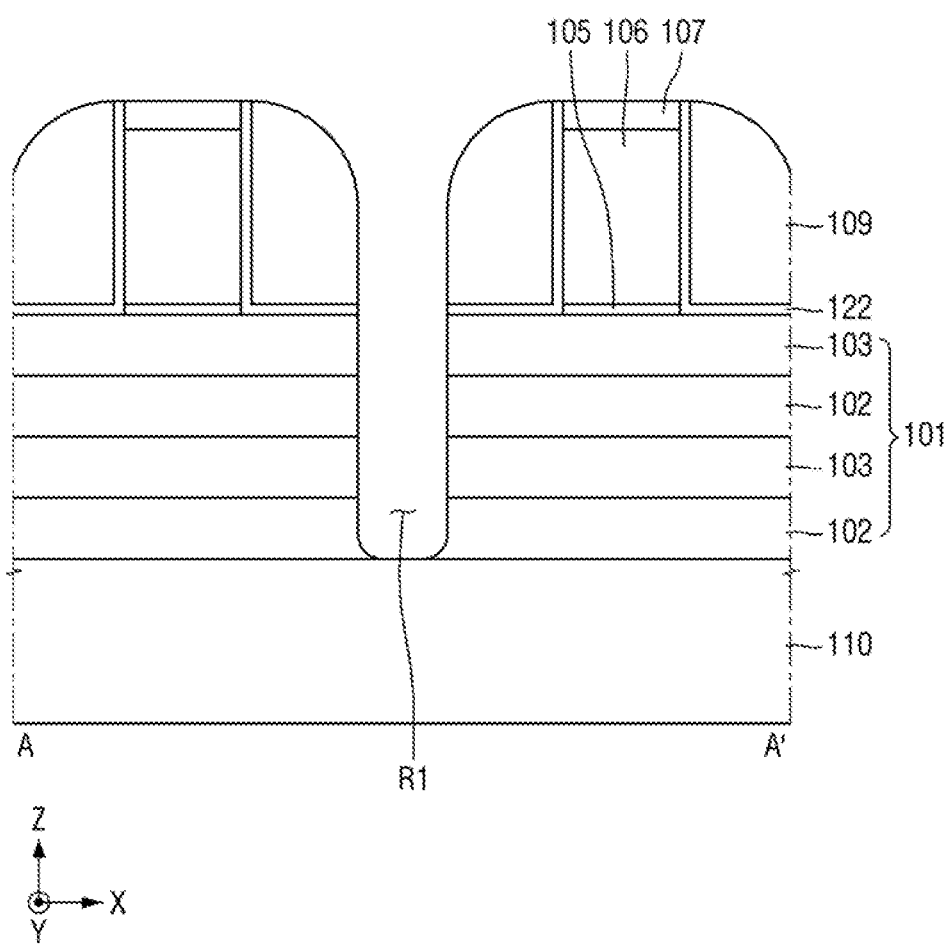
FIG. 17 and FIG. 18 are cross-sectional views describing a method for fabricating a semiconductor device according to an exemplary embodiment of the present inventive concept.

Referring to FIG. 17, in one embodiment, the lower end of the first recess R1 may be formed on the substrate 110. Accordingly, the second internal spacer 143 may not be formed between the substrate 110 and the lower end of the first recess R1.

Figure 18:
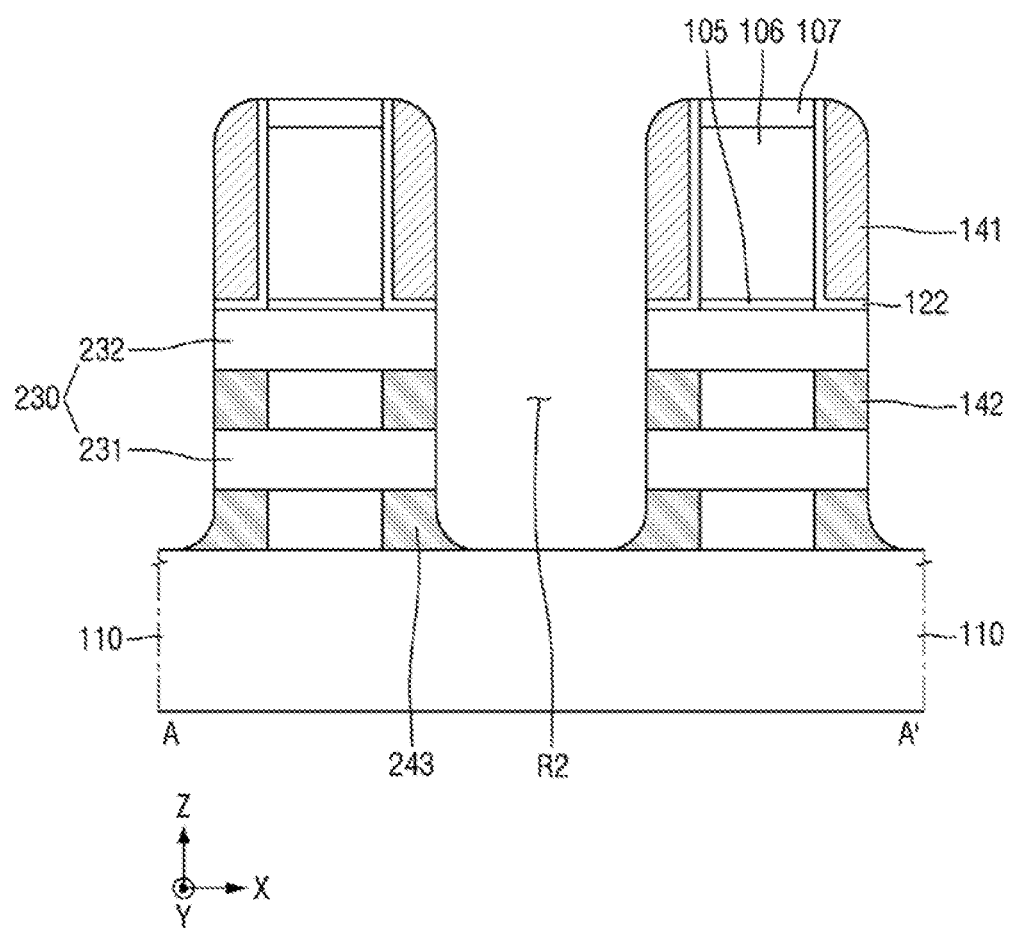

Referring to FIG. 18, in an embodiment, the lower part of the second recess R2 may be formed on the substrate 110. For example, the lower part of the second recess R2 may not be formed in the substrate 110.

Hereinafter, a semiconductor device and a method for fabricating a semiconductor device according to still another exemplary embodiment of the present inventive concept will be described with reference to FIG. 19 through FIG. 24.

Figure 19:
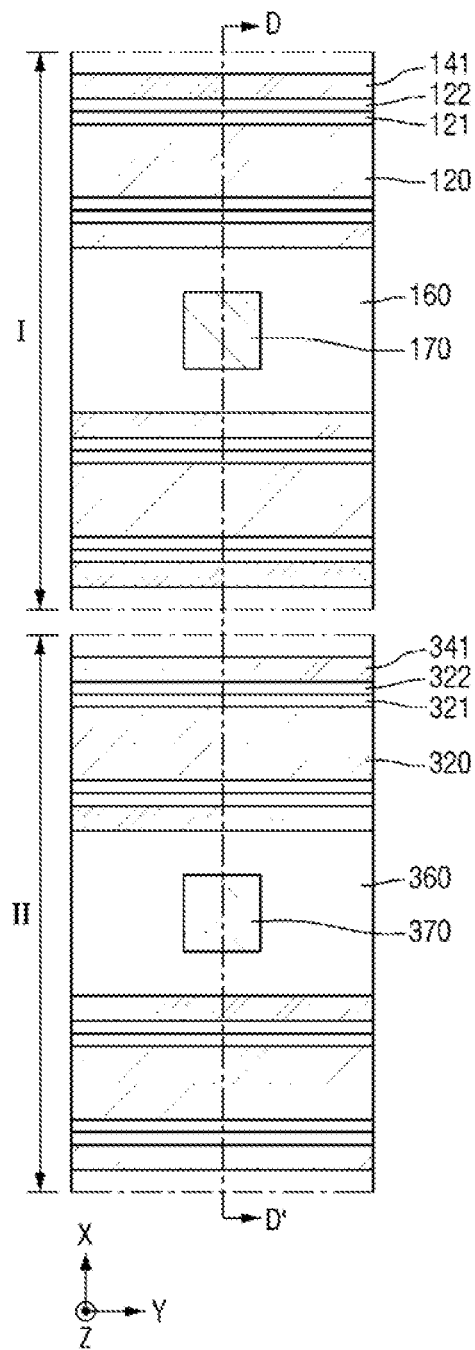
FIG. 19 is a plan view illustrating a semiconductor device according to an exemplary embodiment of the present inventive concept.
Figure 20:
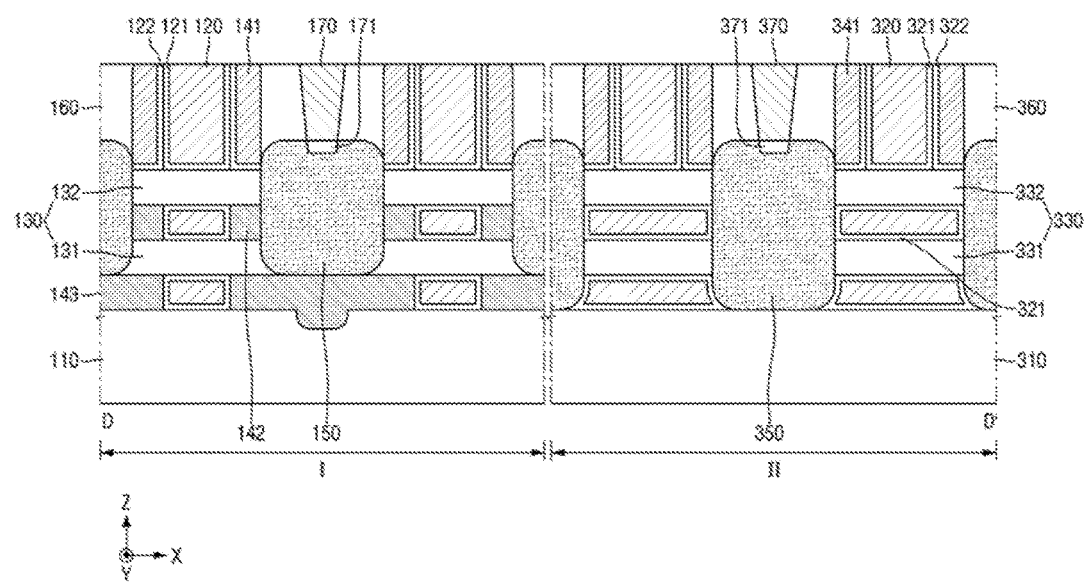
FIG. 20 is a cross-sectional view taken along the line D-D' of FIG. 19.

FIG. 19 is a plan view illustrating a semiconductor device according to an exemplary embodiment of the present inventive concept. FIG. 20 is a cross-sectional view taken along the line D-D' of FIG. 19. FIG. 21 to FIG. 24 are cross-sectional views describing a method for fabricating a semiconductor device according to an exemplary embodiment of the present inventive concept. Description of the semiconductor device and the method for fabricating the semiconductor device already illustrated in FIG. 1, FIG. 2, and FIG. 5 to FIG. 15 will not be described in detail herein except as necessary for a complete understanding of the present inventive concept.

Referring to FIG. 19 and FIG. 20, in one embodiment, the semiconductor device illustrated in FIG. 19 and FIG. 20 includes two regions which are spaced apart from each other in the first direction X. In this case, a first region I may be the NMOS region and a second region II may be the PMOS region. In one embodiment, the semiconductor device formed in the first region I may be the same as the semiconductor device illustrated in FIG. 2.

The semiconductor device formed in the second region II may include a second substrate 310, a second gate electrode 320, a second gate insulating film 321, a second insulating film 322, a plurality of nanowires 330, a second external spacer 341, a second source/drain region 350, a second interlayer insulating film 360, a second contact 370 and a second silicide 371.

In one embodiment, the semiconductor device formed in the second region II of FIG. 20 may indicate that no internal spacer is formed on the side walls of the third nanowire 331 and the fourth nanowire 332. For example, the second source/drain region 350 and the second gate insulating film 321 may be in direct contact with each other, which may be different from the semiconductor device illustrated in FIG. 2.

Further, the side wall of the second gate insulating film 321 adjacent to the second source/drain region 350 may include an inclination profile. For example, the width of the side wall of the second gate insulating film 321 may increase toward the second substrate 310, and the second source/drain region 350 may be formed adjacent to the second substrate 310. For example, the second source/drain region 350 may be in direct contact with the second substrate 310.

Figure 21:
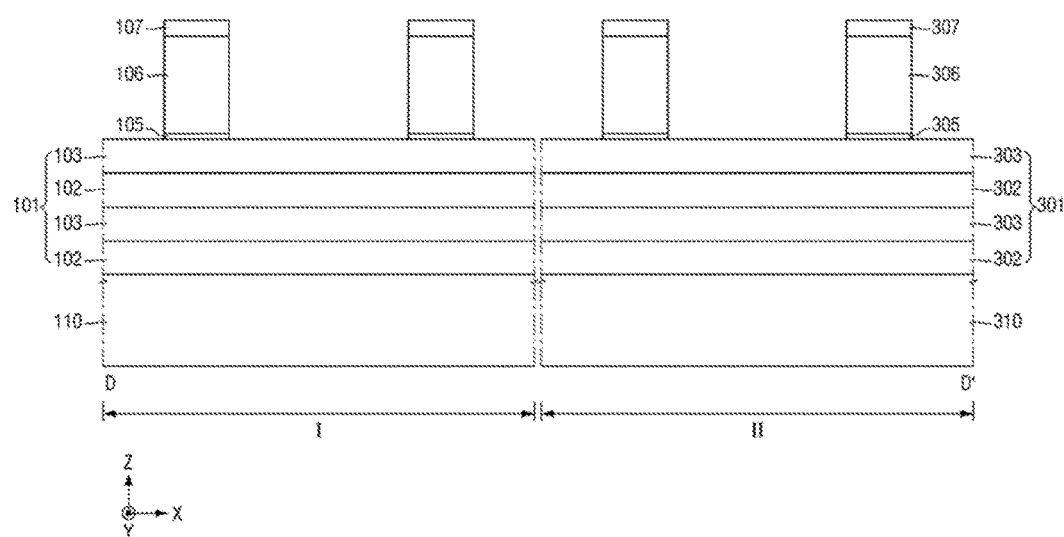
FIG. 21 to FIG. 24 are cross-sectional views describing a method for fabricating a semiconductor device according to one or more exemplary embodiments of the present inventive concept.

Referring to FIG. 21, a first stacked structure 101 in which a first sacrificial layer 102 and a first semiconductor layer 103 are alternately stacked may be formed on a first substrate 110 of the first region I, and a second stacked structure 301 in which a second sacrificial layer 302 and a second semiconductor layer 303 are alternately stacked may be formed on the second substrate 310 of the second region II.

In an embodiment, the first dummy gate insulating film 105 and the first dummy gate 106 may be formed by performing the etching process using the first mask pattern 107, and the first dummy gate insulation film 105 and the first dummy gate 106 may be formed on the first stacked structure 101, and extend in the second direction Y to intersect with the first stacked structure 101. In an embodiment, the second dummy gate insulating film 305 and the second dummy gate 306 may be formed by performing the etching process using the second mask pattern 307, and the second dummy gate insulating film 305 and the second dummy gate 306 may be formed on the second stacked structure 301, and extend in the second direction Y to intersect with the second stacked structure 301.

Figure 22:
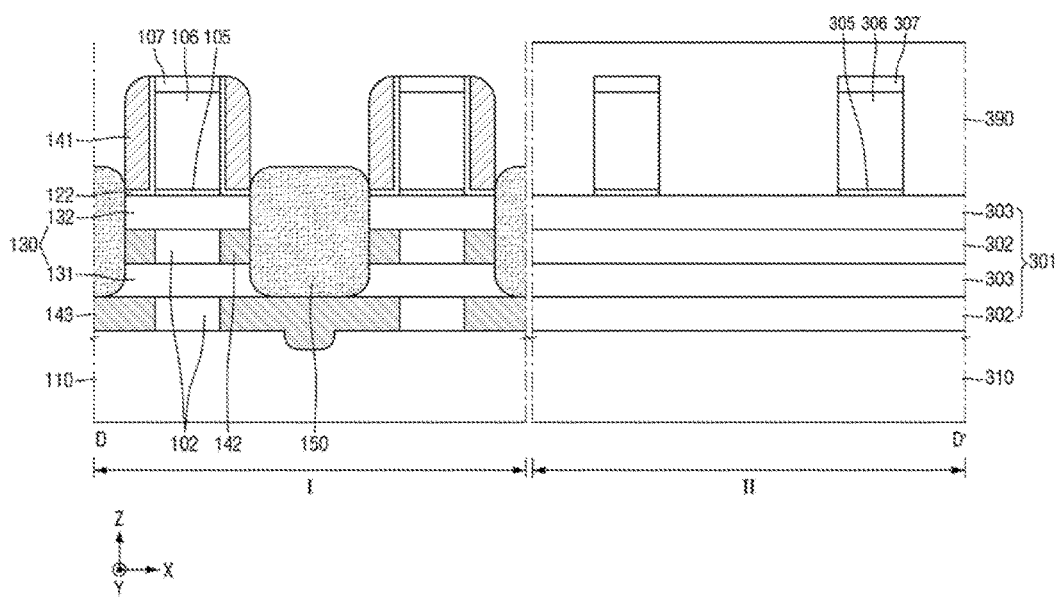

Referring to FIG. 22, a second protective layer 390 may be formed to cover the second stacked structure 301, the second dummy gate insulating film 305, the second dummy gate 306, and the second mask pattern 307 in the second region II.

In an embodiment, the processes described above with reference to FIG. 7 through FIG. 13 may be performed in the first region I.

Figure 23:
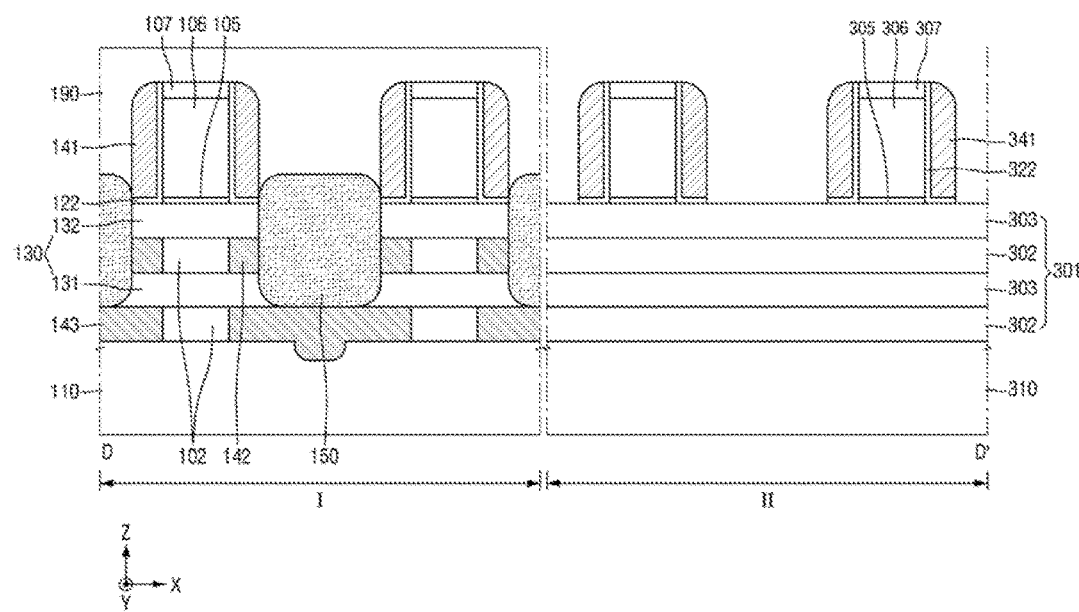
Figure 24:
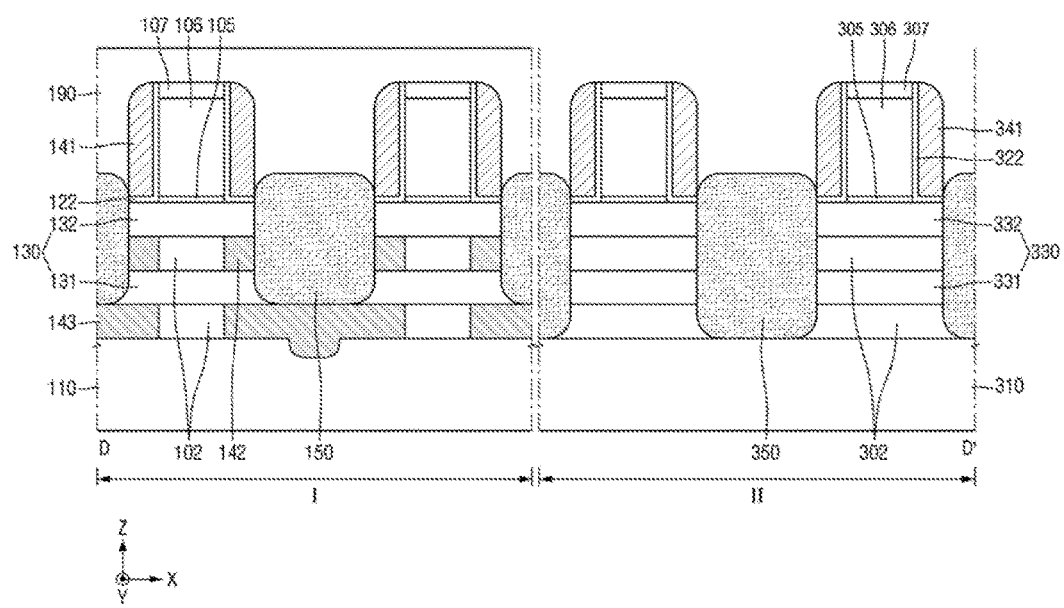

Referring to FIG. 23, the second protective layer 390 may be removed in the second region II, and a first protective layer 190 may be formed on the first source/drain region 150, the first external spacer 141, the first insulating film 122 and the first mask pattern 107 in the first region I.

In the second region II, a second insulating film 322 may be formed on a part of the upper surface of the second stacked structure 301, and on the second dummy gate insulating film 305, the second dummy gate 306 and the second mask pattern 307. For example, the second insulating film 322 may be formed on the side surface of the second dummy gate insulating film 305, the second dummy gate 306, and the second mask pattern 307. The second external spacer 341 may be formed on the side wall of the second dummy gate 306 by forming the second external spacer 341 on the second insulating film 322.

The second stacked structure 301 may be etched using the second mask pattern 307, the second insulating film 322 and the second external spacer 341 as the mask, and a recess may be formed. For example, a lower end of the recess may expose the upper surface of the second substrate 310. The second source/drain region 350 may be formed in the formed recess.

The first protective layer 190 may be removed in the first region I, and the processes described above with respect to FIG. 14 and FIG. 15 may be performed in the first region I and the second region II to fabricate the semiconductor device illustrated in FIG. 20.

Hereinafter, a semiconductor device and a method for fabricating a semiconductor device according to an exemplary embodiment of the present inventive concept will be described with reference to FIG. 25.

Figure 25:
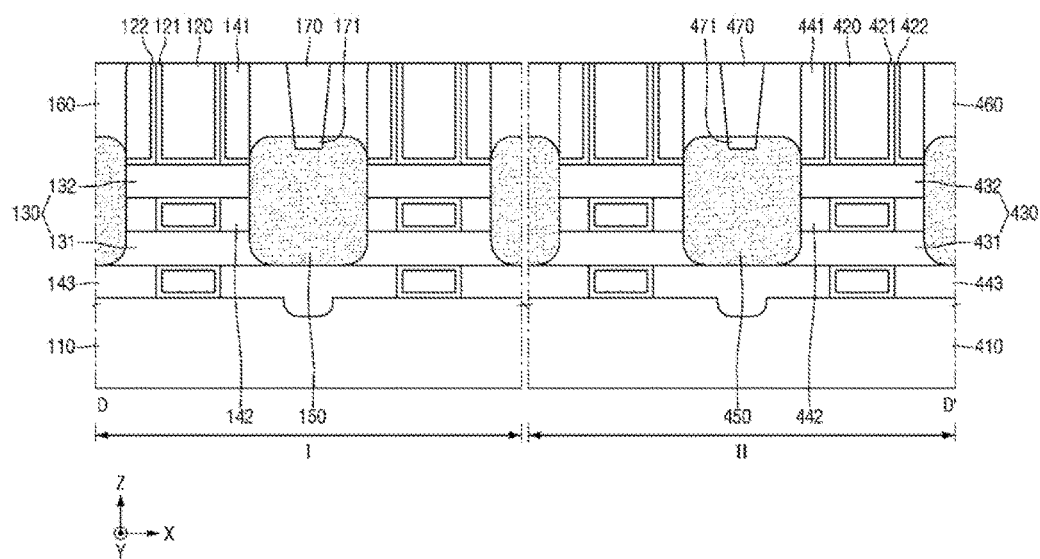
FIG. 25 is a cross-sectional view illustrating a semiconductor device according to an exemplary embodiment of the present inventive concept.

FIG. 25 is a cross-sectional view illustrating a semiconductor device according to an exemplary embodiment of the present inventive concept. Description of the semiconductor device and the method for fabricating the semiconductor device illustrated in FIG. 2, FIG. 5 to FIG. 15 will not be described in detail herein except as necessary for a complete understanding of the present inventive concept.

Referring to FIG. 25, in an embodiment, the semiconductor device illustrated in FIG. 25 may include two regions spaced apart from each other in the first direction. For example, the first region I may be the NMOS region and the second region II may be the PMOS region. For example, the semiconductor device formed in the first region I may be the same as the semiconductor device illustrated in FIG. 2.

The semiconductor device formed in the second region II may include a substrate 410, a gate electrode 420, a gate insulating film 421, an insulating film 422, a plurality of nanowires 430, an external spacer 441, a first internal spacer 442, a second internal spacer 443, a source/drain region 450, an interlayer insulating film 460, a contact 470, and silicide 471.

The semiconductor device illustrated in FIG. 25 may be formed by forming the stacked structure 101, the mask pattern 107, the dummy gate insulating film 105, the dummy gate 106, the insulating film 122, and the dummy spacer 109 on the substrate 110 in the first region I by the processes illustrated in FIG. 5 to FIG. 8. In the second region II, the stacked structure 301, the mask pattern 307, the dummy gate insulating film 305, the dummy gate 306, the insulating film 422, and the dummy spacer 109 may be formed on the substrate 410.

A protective layer may be formed in the second region II, and the processes described above with reference to FIG. 7 through FIG. 13 may be performed in the first region I.

The protective layer may be removed in the second region II, and the protective layer may be formed in the first region I. In one example, the processes described above with reference to FIG. 7 through FIG. 13 may be performed in the second region II.

The protective layer may be removed in the first region I, and the processes described above with reference to FIG. 14 and FIG. 15 may be performed on each of the first region I and the second region II to fabricate the semiconductor device illustrated in FIG. 25.

While the exemplary embodiments of the present inventive concept have been described with reference to the accompanying drawings, the present inventive concept can be manufactured in various different forms rather than being limited to the aforementioned embodiments. A person having ordinary skill in the technical field to which the present inventive concept pertains may understand that the present inventive concept can be provided in other concrete forms, without changing the technical idea and features of the present inventive concept. Therefore, the aforementioned embodiments should be considered in a descriptive sense only and not for purposes of limitation.

What is claimed is:

1. A method for manufacturing a semiconductor device, the method comprising:
    forming a stacked structure including one or more sacrificial layers and one or more semiconductor layers, wherein each sacrificial layer of the one or more sacrificial layers and each semiconductor layer of the one or more semiconductor layers are alternately stacked on a substrate;
    forming a dummy gate structure including a dummy gate and a dummy spacer on the stacked structure;
    etching the stacked structure using the dummy gate structure as a first mask to form a first recess and exposing the one or more sacrificial layers, wherein forming the first recess comprises etching a part of the substrate using the dummy gate structure as the first mask;
    etching a part of the one or more sacrificial layers exposed by the first recess;
    removing the dummy spacer;
    forming a spacer film on the dummy gate, the one or more semiconductor layers and the one or more sacrificial layers;
    etching a part of a semiconductor layer of the one or more semiconductor layers, and a part of the spacer film to form a second recess using the dummy gate and the spacer film formed on a side wall of the dummy gate as a second mask;
    forming an external spacer on the side wall of the dummy gate and an internal spacer on a side wall of the one or more sacrificial layers; and
    forming a source/drain region in the second recess.

2. The method of claim 1, wherein forming the dummy gate structure comprises:
    forming the dummy gate on the stacked structure;
    conformally forming an insulating film on an upper surface of the stacked structure and the dummy gate;
    conformally depositing a dummy spacer film on the insulating film; and
    removing a part of the dummy spacer film to form the dummy spacer on the side wall of the dummy gate.

3. The method of claim 1, wherein a side wall of the internal spacer formed by the second recess and a side wall of the one or more semiconductor layers formed by the second recess are aligned with each other.

4. The method of claim 1, wherein forming the internal spacer comprises forming the internal spacer between the substrate and the second recess, wherein the second recess is formed on the internal spacer.

5. The method of claim 1, wherein the external spacer includes the same material as the internal spacer.

6. The method of claim 5, wherein the external spacer and the internal spacer comprise silicon oxycarbonitride (SiOCN).

7. The method of claim 1, wherein a thickness of the dummy spacer is formed to be greater than a thickness of the external spacer.

8. The method of claim 1, wherein a dielectric constant k of the internal spacer is less than 5.

9. A method for manufacturing a semiconductor device, the method comprising:
    providing a substrate including a first and second regions;
    forming a first stacked structure including a first sacrificial layer and a first semiconductor layer alternately stacked on the first region, and a second stacked structure including a second sacrificial layer and a second semiconductor layer alternately stacked on the second region;
    forming a first dummy gate on the first stacked structure, and a second dummy gate on the second stacked structure;
    forming a second protective layer that covers, the second stacked structure and the second dummy gate of the second region, but not the first stacked structure and the first dummy gate of the first region;
    forming a first dummy spacer film on an upper surface of the first stacked structure and the first dummy gate;
    etching the first dummy spacer film to form a first dummy spacer on a side wall of the first dummy gate;
    etching the first stacked structure using the first dummy gate and the first dummy spacer as a first mask to form a first recess;
    etching a part of the first sacrificial layer exposed by the first recess;
    removing the first dummy spacer;
    forming a first spacer film on the first dummy gate, the first semiconductor layer and the first sacrificial layer;
    etching a part of the first semiconductor layer and a part of the first spacer film to form a second recess, using the first dummy gate and the first spacer film formed on the side wall of the first dummy gate as a second mask, thereby forming a first external spacer formed on the side wall of the first dummy gate and a first internal spacer formed on a side wall of the first sacrificial layer;
    forming a first source/drain region in the second recess;
    removing the second protective layer from the second stacked structure and the second dummy gate of the second region; and
    forming a first protective layer that covers the first source/drain region, the first dummy gate and the first external spacer of the first region, but not the second stacked structure and the second dummy gate of the second region.

10. The method of claim 9, wherein the first region comprises an NMOS region, and the second region comprises a PMOS region.

11. The method of claim 9, further comprising:
    after forming the first protective layer,
    forming a second dummy spacer film on an upper surface of the second stacked structure and the second dummy gate;
    etching the second dummy spacer film to form a second dummy spacer on a side wall of the second dummy gate,
    etching the second stacked structure using the second dummy gate and the second dummy spacer as a third mask to form a third recess;
    etching a part of the second sacrificial layer exposed by the third recess;
    removing the second dummy spacer;
    forming a second spacer film on the second dummy gate, the second semiconductor layer and the second sacrificial layer;
    etching a part of the second semiconductor layer and a part of the second spacer film to form a fourth recess, using the second dummy gate and the second spacer film formed on the side wall of the second dummy gate as a fourth mask, thereby forming a second external spacer formed on the side wall of the second dummy gate and a second internal spacer formed on a side wall of the second sacrificial layer; and
    forming a second source/drain region in the fourth recess.

12. The method of claim 11, wherein a side wall of the first internal spacer formed by the second recess and a side wall of the first semiconductor layer formed by the second recess are aligned with each other, and
a side wall of the second internal spacer formed by the fourth recess and a side wall of the second semiconductor layer formed by the fourth recess are aligned with each other.

13. The method of claim 11, wherein a width of the second recess is greater than a width of the first recess, and
a width of the fourth recess is greater than a width of the third recess.

14. A semiconductor device comprising:
a first internal spacer including a plurality of first gate electrodes spaced apart from each other on a substrate;
a first nanowire formed on the first internal spacer;
a second internal spacer including a plurality of second gate electrodes spaced apart from each other on the first nanowire;
a second nanowire formed on the second internal spacer;
a plurality of third gate electrodes formed on the second nanowire; and
a source/drain region extending between the plurality of second gate electrodes in a direction perpendicular to a surface of the substrate,
wherein the plurality of first gate electrodes, the plurality of second gate electrodes, and the plurality of third gate electrodes are aligned with one another when viewed from a direction perpendicular to the surface of the substrate, and
a gate insulating film is formed on an outer surface of the each of the pluralities of first, second, and third gate electrodes.

15. The semiconductor device of claim 14,
wherein a side surface of the source/drain region is in direct contact with the second internal spacer, the first nanowire, and the second nanowire, and
the side surface of the second internal spacer is vertically aligned with the side surface of the second nanowire.

16. The semiconductor device of claim 14,
wherein a dielectric constant of the first and second internal spacers is less than 5.

17. The semiconductor device of claim 14,
wherein the source/drain region is formed on the first internal spacer, and
a side surface of the first nanowire has a concave shape.

18. The semiconductor device of claim 14,
wherein the source/drain region extends between the plurality of first gate electrodes.

19. The semiconductor device of claim 18,
wherein a side surface of the source/drain region is in direct contact with the first internal spacer, the second internal spacer, the first nanowire, and the second nanowire; and
the side surface of the second internal spacer is vertically aligned with the side surfaces of the first and second nanowires.

* * * * *